US007057709B2

(12) United States Patent
Rosenbluth

(10) Patent No.: US 7,057,709 B2
(45) Date of Patent: Jun. 6, 2006

(54) PRINTING A MASK WITH MAXIMUM POSSIBLE PROCESS WINDOW THROUGH ADJUSTMENT OF THE SOURCE DISTRIBUTION

(75) Inventor: Alan Edward Rosenbluth, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 115 days.

(21) Appl. No.: 10/727,901

(22) Filed: Dec. 4, 2003

(65) Prior Publication Data

US 2005/0122501 A1 Jun. 9, 2005

(51) Int. Cl.
G03B 27/72 (2006.01)
G03B 27/32 (2006.01)

(52) U.S. Cl. .......................................... 355/69; 355/77
(58) Field of Classification Search ................. 355/53, 355/55, 67, 69, 40; 353/34, 97; 356/4.07, 356/4.03; 716/9

See application file for complete search history.

(56) References Cited

U.S. PATENT DOCUMENTS

| 5,680,588 | A | 10/1997 | Gortych et al. ............. 395/500 |
| 6,563,566 | B1 | 5/2003 | Rosenbluth et al. .......... 355/67 |
| 2002/0152452 | A1* | 10/2002 | Socha .......................... 716/21 |
| 2003/0048458 | A1* | 3/2003 | Mieher et al. ............... 356/601 |
| 2004/0156029 | A1* | 8/2004 | Hansen ........................ 355/67 |

OTHER PUBLICATIONS

M. Burkhardt, et al., "Illuminator design for the printing of regular contact patterns," Microelectronic Engineering 41-42 (1998); p. 91.

T.-S. Gau, et al., "The Customized Illumination Aperture Filter for Low k1 Photolithograph Process," SPIE v. 4000—Optical Microlithography XIII, (2000): p. 271.
A. E. Rosenbluth, et al., "Optimum Mask and Source Patterns to Print a Given Shape," Journal of Microlithogrpahy, Microfabrication, and Microsystems v.1, No. 1 (2002): P. 13.
R. Socha, et al., "Illumination optimization of periodic patterns for maximum process window," Microelectronic Engineering 61-62 (2002): p. 57.
A. K. Wong, et al., "Level-specific lithograph optimization for 1-Gb DRAM," IEEE Transactions on Semiconductor Manufacturing 13, No. 1 (Feb. 2000): p. 76.
M. Born et al., Principles of Optics, 5 ed. (Oxford: Pergamon, 1975).

* cited by examiner (Continued)

Primary Examiner—W. B. Perkey
Assistant Examiner—Kevin Gutierrez
(74) Attorney, Agent, or Firm—Daniel P. Morris; Harrington & Smith, LLP

(57) ABSTRACT

A lithographic mask is illuminated with light from different directions such that intensities of a plurality of incident beams of light provide a largest possible integrated process window defined in terms of an allowed range for defining shapes. Constrained sets of intensity parameters are imposed. A first set of intensity parameters represents maximum possible intensities that can be permitted for overexposed tolerance positions. A second set of intensity parameters represents minimum possible intensities that can be permitted for underexposed tolerance positions. Optimum source intensities of incident beams are defined using a linear program and constraints. The optimum source intensities maximize an integrated range of dose and focal variations without causing printed shapes to depart from the allowed range. Apparatus are detailed and variations are described.

7 Claims, 12 Drawing Sheets

PRINTING A MASK WITH MAXIMUM POSSIBLE PROCESS WINDOW THROUGH ADJUSTMENT OF THE SOURCE DISTRIBUTION

TECHNICAL FIELD OF THE INVENTION

This invention relates to manufacturing processes that project high resolution images by illuminating a mask, and in particular to methods for maximizing the manufacturing process window by adjusting the illumination on the mask.

BACKGROUND OF THE INVENTION

Optical lithography has been widely used in the formation of structures included in integrated circuit (IC) chips. Reductions in the size of structures within IC chips have increased the demands placed upon optical lithography systems.

Many methods have been developed to compensate for the image degradation that occurs when the resolution of optical lithography systems approaches the critical dimensions (CD's) of desired lithographic patterns. Critical dimension (CD) refers to the feature size and spacing between features and feature repeats (pitch) that are required by the design specifications, and that are critical for the proper functioning of the devices on a chip. When the critical dimensions (CDs) of a desired IC pattern approach the resolution of a lithographic system (defined as the smallest dimensions that can be reliably printed by the system), image distortions become a significant problem. Currently, the limited resolution of lithography tools poses a challenge to improvements in IC manufacture. The importance of resolution continues to increase as critical dimensions continue to decrease. In order to make the manufacture of future IC products feasible, lithography tools will be required to achieve adequate image fidelity when the ratio of the minimum CD to resolution of the lithographic system is very low.

As an introduction, the resolution ρ (rho) of an optical lithography system can be described by the equation:

$$\rho = k\lambda/NA$$

where ρ is the is the minimum feature size that can be lithographically printed, NA (numerical aperture) is a measure of the amount of light that can be collected by the lens, λ (lambda) is the wavelength of the light source, and k is a factor unique to a given system. One can understand that the resolution ρ is proportional to the wavelength of the light source, and that the image fidelity is improved as diffracted light is collected by the lens over a wider range of directions (i.e., as NA increases). Although a larger NA permits smaller features to be printed, in practice NA is limited by depth-of-focus requirements, by polarization and thin-film effects, by the finite refractive index of the medium (usually air) at the lens exit, and by limitations in lens design. The factor k accounts for aspects of the lithographic process other than wavelength (λ) or numerical aperture (NA), such as resist properties or the use of enhanced masks. In the prior art, typical k-factor values range from about 0.4 to about 0.7. Because of limitations in reducing wavelength λ or increasing numerical aperture NA, the manufacture of smaller IC features (having smaller CD's) will require reducing the k-factor to, for example, the range 0.3–0.4 or smaller, in order to improve the resolution of the lithographic processes.

Components of one embodiment of a projection lithographic system 520 are illustrated in FIG. 1. In FIG. 1, an illumination source 524 provides radiation that illuminates a mask 526, also known as a reticle 526. The illumination source 524 is typically controlled by an illumination controller 522. The terms "mask" and "reticle" may be used interchangeably. Typically, the reticle 526 includes features that act to diffract the illuminating radiation through a lens 530 which projects an image onto an image plane 532, for example, a semiconductor wafer 550 as a substrate 550. The directional extent of radiation transmitted from the reticle 526 to the lens 530 may be controlled by a pupil 401. The illumination source 524 may be capable of controlling various source parameters such as direction and intensity. The wafer 550 typically includes a photoactive material (known as a resist). When the resist is exposed to the projected image, the developed features in the resist closely conform to the desired pattern of features required for the desired IC circuit and devices.

The pattern of features on the reticle 526 acts as a diffracting structure analogous to a diffraction grating which transmits radiation patterns. These radiation patterns can be conveniently described in terms of a Fourier transform in space based on spacing of the features of the diffraction grating (or reticle 526). The Fourier components of diffracted energy associated with the spatial frequencies of the diffracting structure are known in the art as diffracted orders. For example, the zeroth order is associated with the DC component of the mask Fourier transform, while higher Fourier orders arise from modulated patterns in the mask, and are related to the wavelength of the illuminating radiation and inversely related to the spacing (known as pitch) between repeating diffracting features. When the pitch of features is smaller, the angle of diffraction is larger, so that some higher diffracted orders will be diffracted at angles larger than the numerical aperture (NA) of the lens 530. The system 520 may include other apparatus as appropriate, such as, for example, optical filters.

FIG. 5, discussed further herein in the context of an exemplary embodiment, depicts aspects of pixels 1–40 produced by the source 524. FIG. 5 provides a view of the pupil 401, wherein an illumination pupil 402 is also shown, the illumination pupil 402 being that portion of the pupil 401 that is accessible to the illumination source 524. The illumination pupil 402 is typically a central region of the pupil 401, and may be up to about 0.9 NA.

There is increasing interest in methods to optimize the illumination distributions used in photolithography to provide for these small structures. Exemplary U.S. patents include U.S. Pat. No. 5,680,588, "Method and System for Optimizing Illumination in an Optical Photolithography Projection Imaging System," issued to Gortych et al, Oct. 21, 1997; and U.S. Pat. No. 6,563,566, "System and Method for Printing Semiconductor Patterns Using an Optimized Illumination and Reticle" issued to Rosenbluth et al., May 13, 2003.

Other publications in this area include "Illuminator Design For The Printing Of Regular Contact Patterns," M. Burkhardt, A. Yen, C. Progler, and G. Wells, Microelectronic Engineering 41–42, 1998, p. 91; "The Customized Illumination Aperture Filter for Low k1 Photolithography Process," T.-S. Gau, R.-G. Liu, C.-K. Chen, C.-M. Lai, F.-J. Liang, and C. C. Hsia, SPIE v.4000-Optical Microlithography XIII, 2000, p. 271; "Optimum Mask and Source Patterns to Print a Given Shape," A. E. Rosenbluth, S. Bukofsky, C. Fonseca, M. Hibbs, K. Lai, A. Molless, R. N. Singh, and A. K. Wong, Journal of Microlithography, Microfabrication, and Microsystems, Vol. 1, No.1, 2002, p. 13; and, "Illumination Optimization of Periodic Patterns for Maximum Process Window," R. Socha, M. Eurlings, F. Nowak, and J. Finders, Microelectronic Engineering 61–62, 2002, p. 57.

The publication entitled "Optimum Mask and Source Patterns to Print a Given Shape," as well as U.S. Pat. Nos. 5,680,588 and 6,563,566, describe methods for mathematically optimizing the illumination distribution ("source") to obtain the sharpest possible image in focus. However, the publication shows that the sharpness of the focused image does not always correlate with the overall lithographic quality, since a small sacrifice in exposure latitude at best-focus can yield a large increase in depth-of-focus (DOF).

Such complexities in lithographic tradeoffs have long been appreciated outside of the context of numerical optimization. The so-called ED-window (exposure defocus) analysis is a convenient way to assess lithographic quality that takes into account both exposure latitude and depth-of-focus. The integrated area of the ED-window is a useful single-parameter metric for assessing overall image quality. More information in this regard is provided in the publication "Level-Specific Lithography Optimization for 1-Gb DRAM," A. K. Wong, R. Ferguson, S. Mansfield, A. Molless, D. Samuels, R. Schuster, and A. Thomas, IEEE Transactions on Semiconductor Manufacturing 13, No.1, February 2000, p. 76. It is noted that the integrated ED-window, also referred to as the "integrated process window," is the integral with respect to focal range $\Delta z$ of the fractional exposure latitude obtained throughout each focal range.

Solving for a maximal integrated ED-window is problematic. This is because the ED metric involves factors that are conditional, non-linear, and non-differentiable. For example, the exposure latitude attained in a given focal range is locally unaffected by all critical distances (CD) in the pattern, except for a particular CD where the exposure sensitivity is the worst for the pattern. That is, the overall performance of the lithographic process is limited to the performance for the weakest feature. Thus, the ED metric reflects a requirement that all features must be printed within a specified tolerance. Similarly, the exposure latitude attained in the extreme defocused plane of a given focal range is not counted as the final exposure latitude applying in that range. Rather, the quantity that is restrictive is the worst case exposure latitude attained in all of the focal planes within the range. Also, even though image intensity (the reciprocal of exposure) is linear in the source intensity, it is usually only the fractional exposure latitude (a nonlinear quantity) that is considered important, since the absolute dose level can typically be adjusted by changing the exposure time. Finally, the result of integration over the focal range that is used to obtain the final figure of merit (i.e., the integrated ED window) must be truncated at the depth-of-focus range where the exposure latitude first drops to zero. This variable truncation represents another non-linear quantity.

These complications limit the reliability of heuristic methods for optimizing lithographic sources over extended focal ranges. Prior art heuristic methods are described in U.S. Pat. Nos. 5,680,588 and 6,563,566, as well as in the publication entitled "Illumination Optimization of Periodic Patterns for Maximum Process Window." Some of these methods attempt to optimize the image with respect to focus and exposure by applying the focused-image algorithm in multiple focal planes. One may note that an image which has been optimized across multiple focal planes may still exhibit variation in CD through the depth-of-focus, even though the image has been made sharp in each focal plane. Within the context of the teachings for this prior art, one method of addressing this problem is through the addition of CD constraints across the depth-of-focus. However, such equality or band constraints would predictably require adjustment on an ad-hoc or iteration-by-iteration basis, since the depth-of-focus and exposure latitude tradeoff is highly variable from pattern to pattern, and therefore difficult to predict.

Another prior art heuristic algorithm is introduced in the publication entitled "Illumination Optimization of Periodic Patterns for Maximum Process Window." In this algorithm, the intensity given to each source point (i.e., each illumination direction) is in one embodiment calculated by forming products of two weighting factors, and then summing these products over all pairs of amplitude diffraction orders that the lens 530 collects from the source direction in question. A first of two weighting factors used is (the absolute value of) the intensity spatial frequency produced by the pair of amplitudes. Thus, weighting provides for preferentially augmenting high spatial frequencies in order to sharpen the image. The second weighting factor is obtained by first calculating the normalized derivative with respect to focus of the particular two-order intensity in question. The weighting factor is then calculated by subtracting from 1 the ratio of the focal slope to the maximum focal slope encountered amongst all source points and image frequencies (so that this weighting factor ranges from 1 to 0). Variations of the method are provided, all of which involve similar weighting heuristics. These heuristics are plausibly designed and have been shown to perform acceptably in certain examples.

However, and as with the other methods discussed above, images improved by heuristic methods are not guaranteed to meet standard lithographic criteria for optimal behavior through the depth-of-focus. For example, lithographic performance is customarily considered to be limited by the quality of the least robust printed feature or CD (i.e., the relevant criterion is whether or not every feature is printed within tolerance; if one feature fails, the successful performance of all other features is effectively irrelevant).

Unfortunately, a filtering algorithm that emphasizes features with minimal focus and exposure sensitivity can underemphasize the weakest (and therefore most critical) features in the image. Although adjustments could be introduced on an ad-hoc basis to deal with such limitations, these typically do not directly address the problem. With heuristic algorithms, one must usually expect such difficulties will arise, and performance will typically become less reliable when the heuristic adjustments are made more abstract (i.e., when the adjustments do not directly embody the features of the problem which must be solved). On the other hand, standard general-purpose methods for optimization, though non-heuristic, are based on refinement of an initial starting design, and so are limited by the quality of this initial design (i.e., the solutions provided are usually no better than the particular local optimum associated with the design used to start optimization). This local optimum is not, in general, the desired global optimum. Some general-purpose optimization methods, for example genetic algorithms, do attempt to search beyond the initial local optimum, but there is no guarantee that they will find the global optimum. This is particularly true when more than a few variables are involved, since the potential search space becomes immense. Heuristic methods in some sense consider the properties of the entire search space, but they do so in an uncertain way, and they also do not guarantee that the globally optimum solution is found.

Despite some inherent weakness, heuristic algorithms can often improve the quality of a lithographic image. However, these algorithms leave room for improvement. For example, one would usually expect source weightings that are chosen by heuristic methods to produce appreciable CD errors; correction of these errors using known techniques (e.g. using an optical proximity correction (OPC) program) will in turn change the behavior of the image, and there is no guarantee that iterated cycles of heuristic source optimization and OPC adjustment will converge to an optimal solution.

Although heuristic algorithms can deliver better lithographic images than earlier techniques, the required adjustments to same are not conducive to routine use. What is needed is a method for illuminating the mask 526 with a source 524 that may be used to optimize the image according to an accepted lithographic criterion, such as maximization of the integrated process window through focus.

SUMMARY OF THE INVENTION

The foregoing and other problems are overcome by methods and apparatus in accordance with embodiments of this invention. Disclosed herein are techniques to produce a source pattern for illumination of a lithographic mask in such a way that the maximum possible integrated process window is obtained.

One aspect of the teachings herein includes a mask illumination method, which calls for illuminating a lithographic mask with a source of light from different directions such that intensities of a plurality of incident beams of light provide a largest possible integrated process window defined in terms of an allowed range for defining shapes, by imposing, through application of at least one set of constraints, a first set of intensity parameters for representing maximum possible intensities that can be permitted for overexposed tolerance positions and a second set of intensity parameters for representing minimum possible intensities that can be permitted for underexposed tolerance positions; defining, for each of a plurality of different focal ranges, at least one parameter for each of the first set and the second set; and, determining optimum source intensities using a linear program and constraints that include at least said one set of constraints, where the determined optimum source intensities maximize an integrated range of dose and focal variations without causing printed shapes to depart from the allowed range.

Another aspect of the teachings herein includes a method to conform a projected pattern to a range of shapes within a maximized total range of defocus positions and exposure doses, by illuminating a set of mask patterns from a plurality of source directions each having adjustable intensity, projecting an image of the mask patterns from each of the source directions onto an adjustable total range of defocused planes, establishing proportionalities between the adjustable source intensities and the projected intensities along the darkest boundaries of the range of shapes, establishing proportionalities between the adjustable source intensities and the projected intensities along the brightest boundaries of the range of shapes, constraining a first limiting intensity parameter in each of the defocused planes to the maximum projected intensity along the darkest boundaries of the range of shapes, constraining a second limiting intensity parameter in each of the defocused planes to the minimum projected intensity along the brightest boundaries of the range of shapes, constraining the first limiting intensity parameter in each particular defocused plane to the maximum of the maximum intensities within the range of defocus positions bounded by the particular defocused plane, constraining the second limiting intensity parameter in each particular defocused plane to the minimum of the minimum intensities within the range of defocus positions bounded by the particular defocused plane, determining the values of the adjustable source intensities and the total range of defocus planes which maximize the difference between the sum of the maxima of maximum intensities and the sum of the minima of minimum intensities, and adjusting the adjustable source intensities to the difference-maximizing values.

A further aspect of the teachings herein includes a method to obtain an illumination source solution for illuminating at least one mask for printing a pattern defined by the at least one mask, by supplying mask shapes and an allowable range of printed shapes; determining sample points; using a source pixelation, determining proportionalities between source intensities and sample point intensities, for individual ones of a plurality of focal planes; determining a maximum allowable intensity at dark sample points, and a minimum allowable intensity at bright sample points; constraining a first intensity parameter in each focal plane to a maximum intensity among sample points at dark boundaries of the shape range; constraining a second intensity parameter in each focal plane to a minimum intensity among sample points at bright boundaries of the shape range; constraining the first intensity parameter in each focal plane to a maximum intensity bound within a truncated focal range; constraining the second intensity parameter in each focal plane to a minimum intensity bound within the truncated focal range; and executing a focal range loop, that includes selecting an initial defocus limit; maximizing a difference between a sum of the bounded maximum intensities and a sum of the bounded minimum intensities; and iterating by increasing the defocus limit so long as the constraints are met, otherwise terminating the focal range loop and outputting a result that provides a maximum difference between the sum of the maximum intensities and the sum of the minimum intensities.

Also taught herein is a system for illuminating a mask, that includes apparatus for illuminating a photolithographic mask with light from different directions such that intensities of a plurality of incident beams provide a largest possible integrated process window defined in terms of an allowed range for defining shapes, the illuminating apparatus including further apparatus for imposing, through application of at least one set of constraints, a first set of intensity parameters for representing maximum possible intensities that can be permitted for overexposed tolerance positions and a second set of intensity parameters for representing minimum possible intensities that can be permitted for underexposed tolerance positions; apparatus for defining, for each of a plurality of different focal ranges, at least one parameter for each of the first set and the second set; and apparatus for determining optimum source intensities using a linear program and constraints that include at least said one set of constraints, where the determined optimum source intensities maximize an integrated range of tolerable dose and focal variations without causing printed shapes to depart from the allowed range.

Another aspect of the teachings herein includes a method for minimizing a loss in an integrated process window, the loss resulting from perturbations in a plurality of masks, each mask containing features for printing a common shape, where the perturbations span the range of errors that must realistically be expected when the features are fabricated on a typical mask using a practical mask-making process, the method includes illuminating each mask with a source of light from different directions according to a common window, wherein illumination is such that intensities of incident beams of light provide a largest possible integrated process window for printing the common shape within the allowed range using every perturbed mask, with the same exposure and focal range used for each mask, the integrated process window defined in terms of an allowed range for defining the common shape, wherein the largest possible integrated process window comprises an integrated range of dose and focal variations for printing the common shape without causing the printed common shape to depart from the allowed range.

Also disclosed are teachings for a method to provide an empirical yield improvement in at least one printed feature produced by a lithographic system by, through application of at least one set of constraints, imposing a first set of intensity parameters for representing maximum possible intensities that can be permitted for overexposed tolerance positions and a second set of intensity parameters for representing minimum possible intensities that can be permitted for underexposed tolerance positions; defining, for each of a plurality of different focal ranges, at least one parameter for each of the first set and the second set; determining optimum source intensities using a linear program and constraints that include at least the one set of constraints; specifying a bias that provides for an offset from a critical dimension of a design specification for each printed feature; and, limiting changes in the source intensities to introduce the bias.

Aspects of methods disclosed herein may be implemented by computer executable instructions stored on computer readable media.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 1:
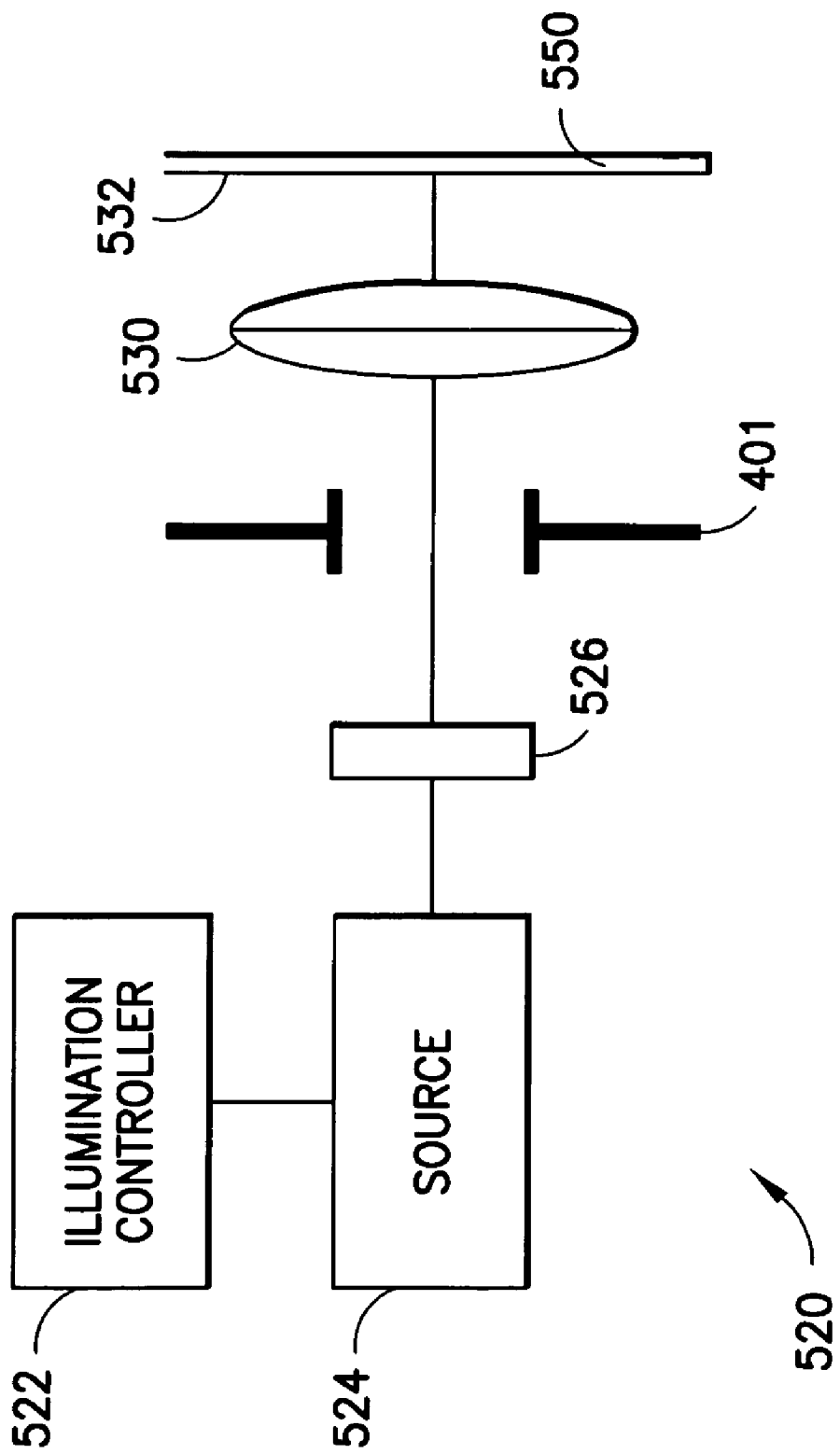
FIG. 1 illustrates basic components of a projection lithographic system as known in the art.

Disclosed herein are methods and apparatus for maximizing the process window through adjustment of the source distribution.

As used herein, the process window is defined as a set of limits or tolerances for the various imaging parameters. The process window takes into account the extremes of the range of lengths and widths that are allowed for the shapes, and the range of dose and focus variations which print all shapes within the allowed extremes. In many cases, one set of shape limits corresponds to underexposed print conditions, and another set to overexposed conditions. Sample points may be used to delineate the limits of allowable shapes according to two-dimensional criteria.

An optimum source pattern is expressed as a list of optimum values for the intensity of light that should be input to the mask from each possible illuminating direction. The possible illuminating directions (also referred to as "source directions") are defined using a gridding of direction space, which may also be referred to as a pixelation of direction space. Thus, the "source direction" may actually refer to a small range of directions that are contained within one pixel contained in the source grid.

Once the source pixelation has been determined, proportionalities are determined between the intensity of each source direction and the resulting image intensity. This is performed for each of a number of possible focal planes. The intensities at image sample points are considered.

The source intensities are then transformed into ratios, defined as fractions of the total source intensity. A first set of limiting intensity parameters is produced. The first set represents the maximum intensity that arises at sample points on the relatively darker boundaries of allowed shapes, in each of a number of focal planes. This maximum intensity determines the maximum exposure dose that can be tolerated without producing an overexposed condition on the wafer. These first parameters are not actually set equal to the maximum intensities (as determined by the source intensity proportionalities). Instead, these limiting intensity parameters are constrained to be no smaller than any of the source-determined intensities. Such inequality constraints (that are nominally less specific than equality constraints) allow the optimum source solution to be determined, as the inequality constraints are ultimately made to automatically yield equality. Similarly, a second set of limiting intensity parameters are preferably constrained to be no larger than the source determined intensities for underexposed sample points. One parameter of each set is defined for each of a number of different focal ranges. Other constraints are defined, for example so as to require bright regions of the image to print bright, and dark regions to print dark. Additional constraints may limit the intensity that can be provided by a given source direction according to the brightness limitations of the exposure system.

An optimum set of source intensities can then be determined from these constraints, where the optimum source intensities are those that maximize the integrated range of intensity dose and focal variations that can be tolerated without causing the printed shapes to depart from the allowed range of shapes.

Figure 6:
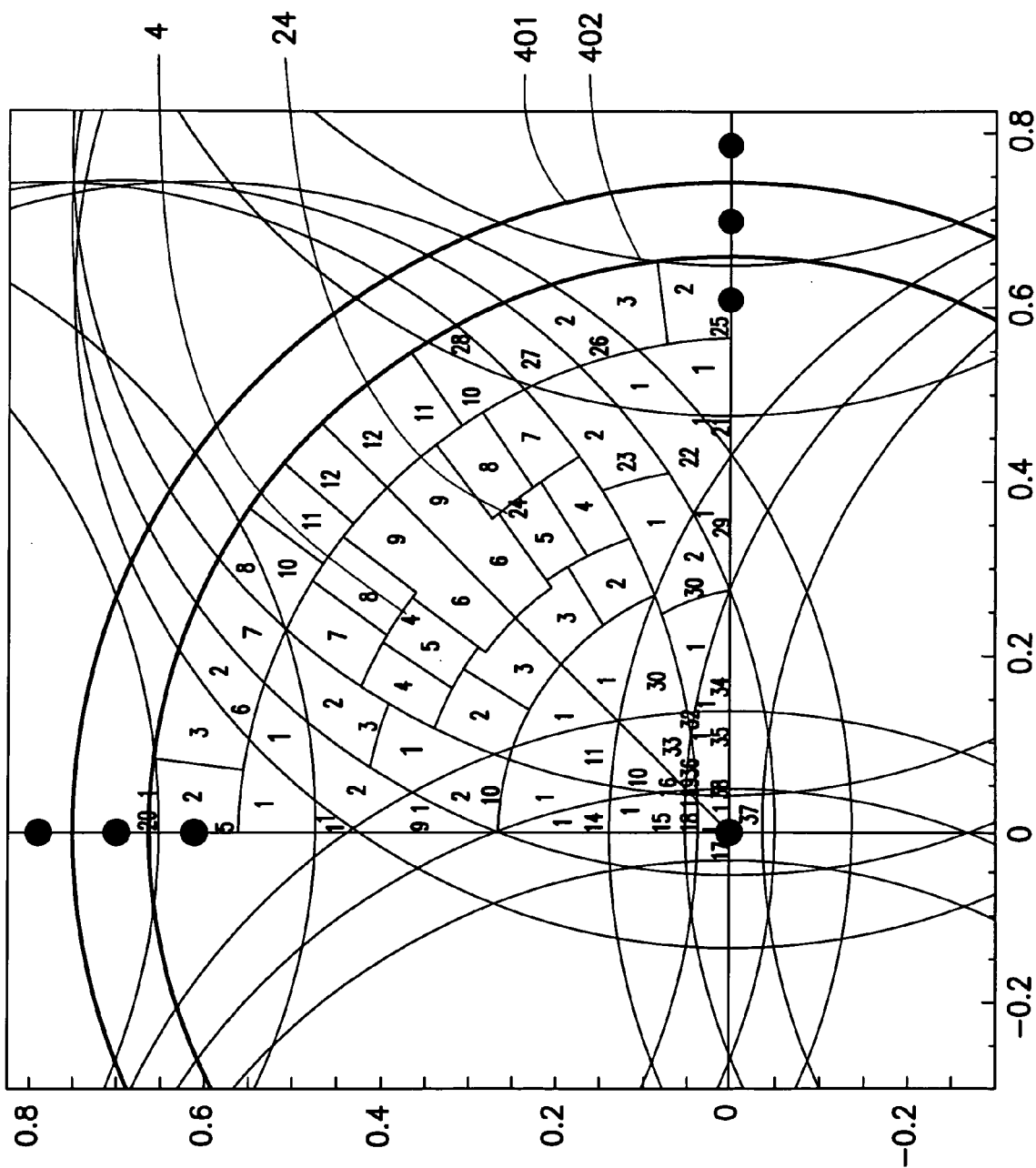
FIG. 6 shows an improved pixelation of the source, for the FIG. 2 example.

The teachings herein make use of a photolithography system wherein the illumination pupil 402 (see, for example, FIG. 6) is divided into pixels 1–40 (referred to as "pixelated" or as "pixelation" as appropriate). As discussed further below, the use of forty pixels, or pixels in the specific position of pixels 1–40 as in FIG. 6, is only illustrative of techniques involving the example depicted in FIG. 2. Accordingly, the example provided in FIG. 2, and the ensuing discussion thereof, is not limiting of the teachings herein.

Pixelation of the illumination pupil 402 is used to provide for determination of the optimum illumination distribution. The illumination pupil 402 is that portion of the pupil 401 that is accessible to the illumination source. The illumination pupil 402 is typically about 0.9 times the numerical aperture of the lens 530 (0.9 NA). Aspects of optimizing illumination in terms of pixelation are disclosed in U.S. Pat. No. 5,680,588, the disclosure of which is incorporated by reference herein in its entirety.

The pixelation may use a programmable mirror array with very high pixel-density. In such a configuration, the pixels 1–40 that are employed during optimization can be formed as groups of fine physical pixels in the mirror array. Another example of pixelation involves unfolding of the illuminating angular space that is defined by multiple fold reflections arising in a light tunnel homogenizer.

The pixelated image does not have to be densely packed, nor does it have to be based on a Cartesian subdivision of the pupil. Individual pixels 1–40 do not have to be contiguous. Preferably, the individual pixels 1–40 represent source elements whose intensity can be individually adjusted. The algorithm disclosed herein can use virtually any set of source elements. Preferably, each source element may be represented by a set of illumination directions, with bilateral symmetry about horizontal and vertical planes, to avoid image skew through focus. The method disclosed herein has at least one advantage of being adaptable to whatever pixelation techniques a given exposure system implements. However, for purposes of the disclosure herein, a pixelation method that provides certain computational advantages is discussed. One skilled in the art will recognize that the pixelation techniques discussed herein are not limiting of these teachings, and therefore are merely illustrative.

Once the illumination pixelation is defined, the optimum illumination source can be expressed formally as an unknown vector set $\vec{s}$. That is, $\vec{s}$ is initially a list of unknown optimum intensity values for each of the source elements. In the image plane the intensity at a given point can then be written as a sum of contributions from each unknown source element. That is, the intensity at a given point in the image plane can be expressed as $\vec{s} \cdot \vec{I}$. Note that the intensity contributions from different elements add incoherently, and that the intensities $\vec{I}$ provided by the different elements can be calculated using known methods, such as those presented in the text "Principles of Optics" M. Born and E. Wolf, 5$^{th}$ Ed., Pergammon Press, 1975. For convenience, these intensities are referred to as "trial intensities." Thus, the exposure (the reciprocal of intensity) at a given sample point in the image plane (in this case the i$^{th}$ sample point) is expressed as:

$$E_i = \frac{1}{\vec{s} \cdot \vec{I}_i(x, z)}. \qquad \text{(Eq. 1)}$$

A desired image shape is specified using sample points that map out the nominally bright and dark regions of the image, and the boundaries of the allowable range of shapes for the printed features. In one embodiment, the shape is specified by a preliminary user-input step. In another embodiment, the sample points are automatically produced along a grid in the image.

A notational convention is used herein for distinguishing between bright and dark sample points where the subscript index i is replaced by either the subscript index u for representing bright sample points, or the subscript index v for representing for dark sample points.

Additional sample points are chosen near key target edges. That is, edge sample points are chosen at or near the desired edge positions of CDs in the image. Edge sample points are denoted herein by the index subscript r. For purposes of discussion, the CD slice for the r$^{th}$ edge is considered to cut the aerial image along a coordinate x, independent of whether the orientation of the feature edge is actually horizontal, vertical, or non-Manhattan. The CD slice can thus be regarded as a plot of intensity versus x in a direction through the sample point that is locally perpendicular to the feature edge (which could in general be curved, e.g. the perimeter of a contact hole).

Typically, three sample points are associated with the r$^{th}$ edge. The first sample point is located precisely at the desired target perimeter for the feature. The intensity at this sample point is denoted as $\vec{s} \cdot \vec{I}_r(0, z)$. Thus, x is a local coordinate that is associated with the edge. Preferably, x is defined in such a way that x=0 always represents the target edge location. Once a CD tolerance is specified for the feature, other sample points can be established. In some cases, particularly with two dimensional patterns, it is not necessary to define both the CD+ and the CD– range limits for the shape along every cutline. For example, if the pattern consists of an array of small contact holes, one might place cutlines along horizontal and vertical diameters, and also along diagonal diameters. With such a pattern, one would typically specify CD+ and CD– diameter limits along the horizontal and vertical diameters. Assuming this were done, it would then not usually be necessary to include the CD– limits along the diagonal cutlines, since the four CD– limits along the horizontal and vertical cutlines would be quite closely positioned within the interior of the contact hole. However, in such cases, CD+ limits along the diagonals would usually still be necessary.

Placement of the next sample points accounts for exposure conditions. That is, if overexposed, line-like features will contract and space-like features expand. Once a CD tolerance is specified for the feature (or a combined CD+ position shift tolerance), a sample point can be placed at a position along the associated CD slice which would be associated with an extreme position for allowable overexposure. This sample point position is denoted as: x=CD+. The intensity at x=CD+, for defocus z, is then denoted as: $\vec{s} \cdot \vec{I}_r(CD_+, z)$. Note that overexposure causes edges to be printed in regions where the intensity is lower, so that x=CD+ corresponds to a darker part of the image than does x=0. Likewise, x=CD– designates a sample point at the position of worst allowable underexposure, and $\vec{s} \cdot \vec{I}_r(CD_-, z)$ represents the intensity at this point. The set of points $CD_{r,+}$ and $CD_{r,-}$ (as r is varied) thus constitute a range of allowable shapes for the mask patterns.

Figure 2A:
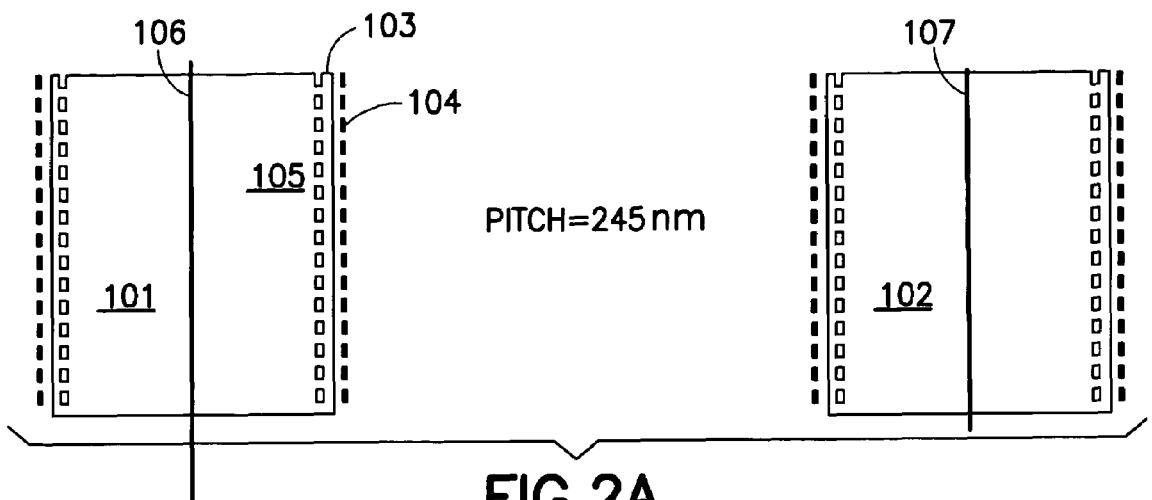
FIGS. 2A–C, collectively referred to as FIG. 2, show an example of a set of lithographic target features which, when printed, have shapes falling within a certain prescribed range.
Figure 2B:
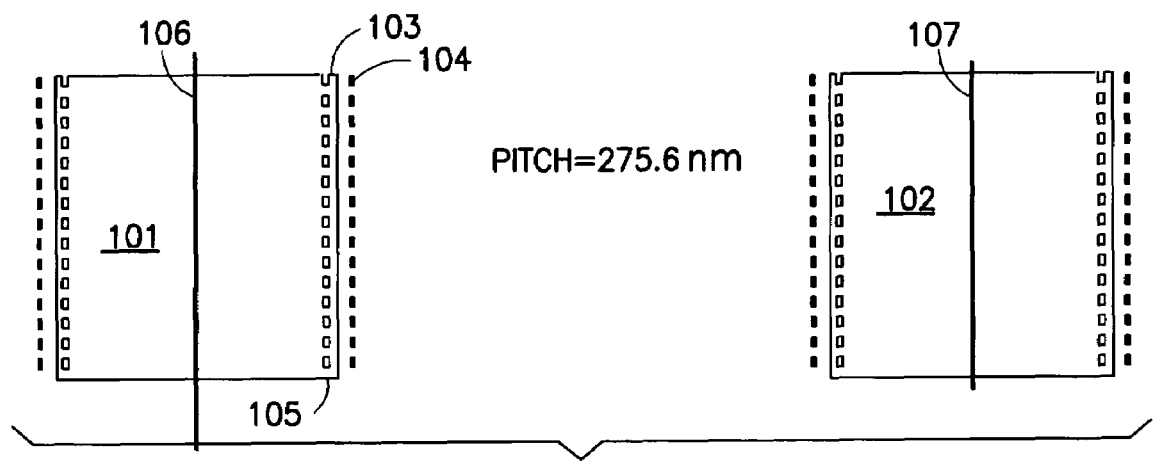
Figure 2C:
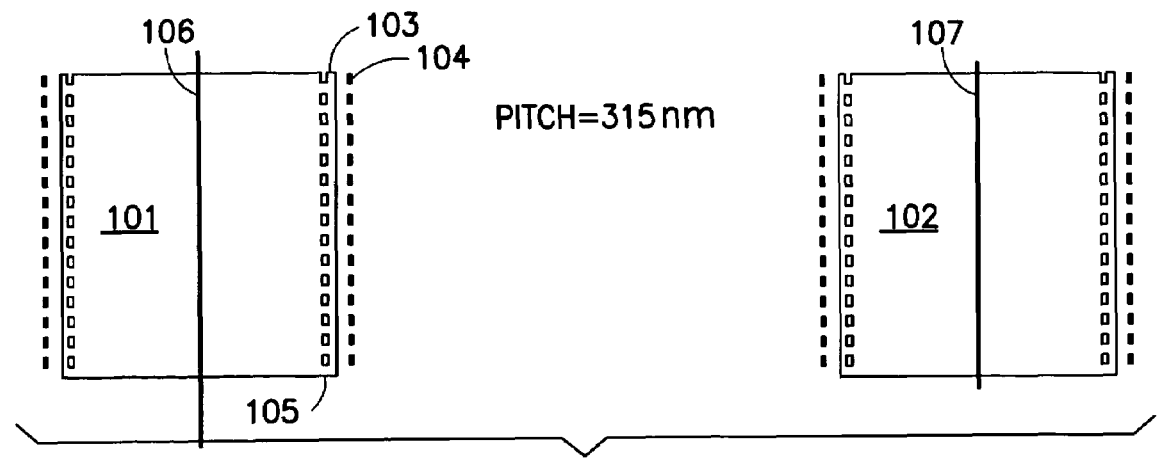
Figure 3A:
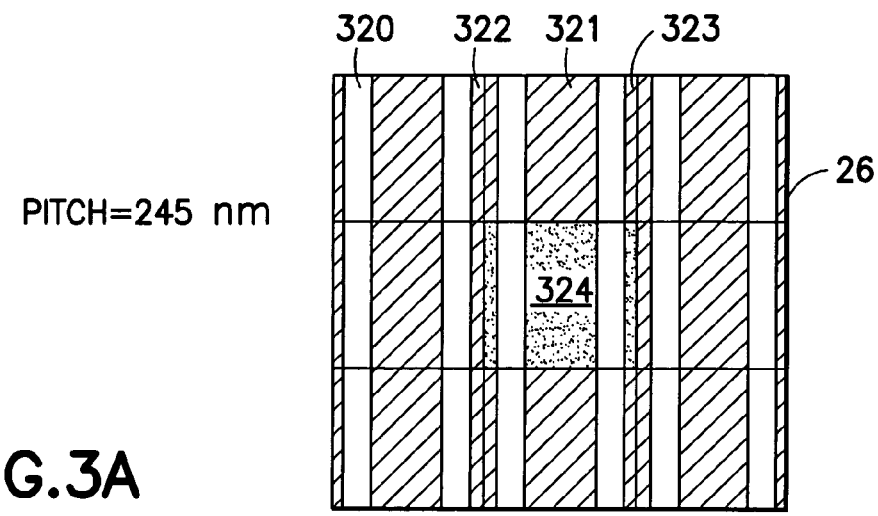
FIGS. 3A–C, collectively referred to as FIG. 3, show an exemplary set of masks that correspond to the shapes appearing in FIG. 2.
Figure 3B:
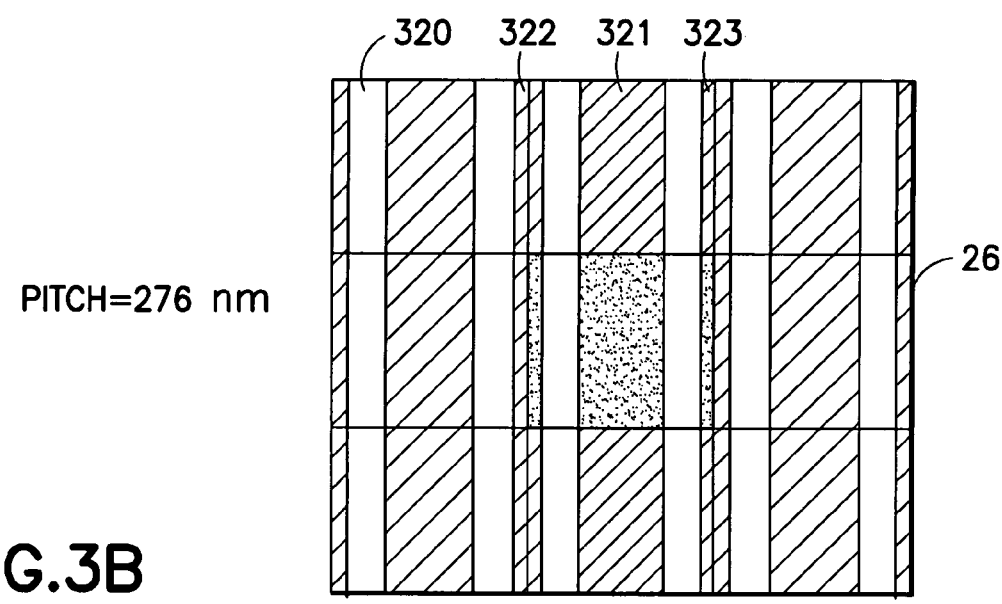
Figure 3C:
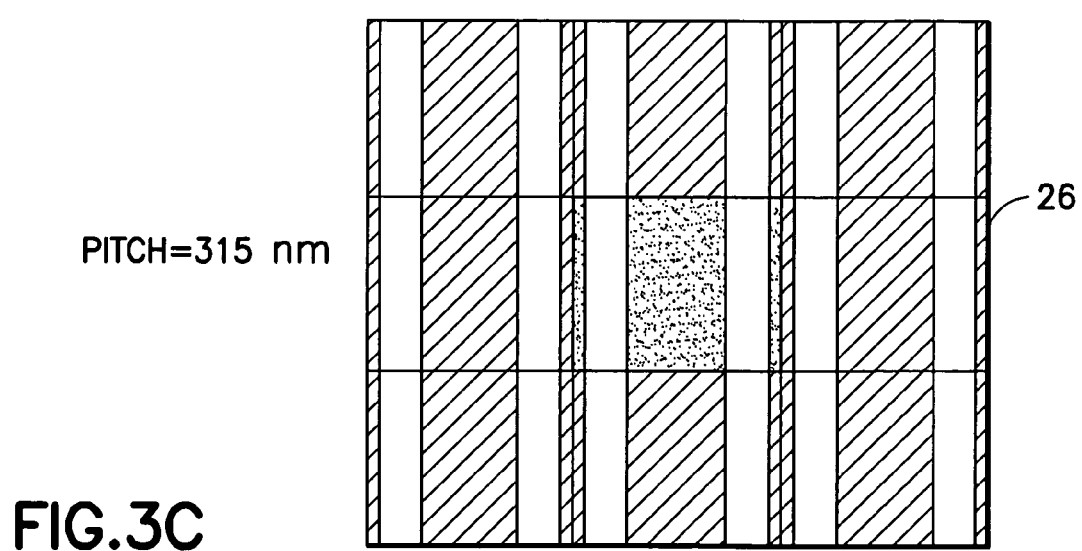

Exemplary aspects of placement of the additional sample points near key target edges are illustrated in FIGS. 2–4.

These figures illustrate aspects of the problem of maximizing the integrated common process window for the printing of mask patterns as shapes. In the embodiment illustrated, the shapes form lines. The lines are illustrated as dark images, as in the case of a positive resist. Note that the discussion herein is generally presented in terms of using a positive resist. However, use of a positive resist is not considered limiting, for example, the method works equally well using a negative resist.

FIGS. 2A–2C illustrate portions of a larger image (not shown). In each of these figures, a pair of lines 101, 102 is presented. In the larger image, the line features extend indefinitely in the vertical direction, and are formed by dark regions of the exposing image. Note that such one-dimensional patterns are only chosen as an example. In general, the patterns may have an arbitrary two-dimensional shape. In the exemplary embodiments depicted in FIG. 2, the lines 101, 102 are each 87.5 nm wide. The larger image also contains additional vertical lines that are parallel to the pair shown, and that are spaced apart by the same distance (i.e., these lines are formed, or "printed", in periodic arrays). The period is referred to as a "pitch," and FIG. 2 presents embodiments over a range of pitches. The exemplary 87.5 nm wide line patterns repeat periodically, with repeat distance (centerline separations) of 245 nm, 275.6 nm, and 315 nm.

Referring to FIG. 2A, shaded region 101 represents a first line 101 of the pair of lines. Region 102 represents a second line which is separated from line 101. The centerline 106, or origin 106, of the first line 101 is separated from the centerline 107 of the second line 102 by 245 nm. The first line 101 has a nominal (design) edge 103 that appears at a distance that is symmetric about the centerline 106 (i.e., in this case, at 43.75 nm). FIG. 2B represents the pair of lines 101, 102 having a 275.6 nm pitch. FIG. 2C corresponds to the pair of lines 101, 102 having a 315 nm pitch.

In the example of FIG. 2, the pitches have a common multiple of 2205 nm, where 245 nm*9=2205 nm; 275.6 nm*8=2205 nm; and, 315 nm*7=2205 nm. That is, the three sample pitches illustrated are formed from those diffraction orders of the 2205 nm common pitch which are multiples of 7, 8, or 9. Although the exemplary pitches provided have a common multiple pitch, this is considered illustrative, and not limiting of this invention.

One will recognize that achieving exact size or shape may be difficult to realize, and is not even required. That is, for any given shape 101, 102 there is generally a range of printed shapes that are acceptable. FIG. 2A depicts aspects of a range of acceptable shapes for the exemplary first line 101.

In FIG. 2A, minimum allowable exposure line 104 is depicted. The minimum allowable exposure line 104 corresponds to an acceptable increase in line width of +9%. This increase is assumed to be the maximum that can be tolerated in this example. That is, the minimum allowable exposure line 104 is 9% further from the origin 106 than the nominal edge 103. Exposure below a certain dose level that, as explained below, is calculated from the trial intensities to be the dose that causes the right edge of 101 to be printed at position 104, will cause undesired undeveloped resist to remain even on the right side of 104. That is, exposure below this dose level will cause the line 101 to print wider than the allowable +9% tolerance. Therefore, the intensity along the minimum allowable exposure line 104 governs the tolerance for the printed edge. If, for example, the image intensity along the minimum allowable exposure line 104 were 10% larger than the intensity at the nominal edge 103, then a decrease in dose from nominal of more than 10% would cause line feature 101 to print excessively wide.

Similarly, position 105 shows the position of maximum allowable exposure, corresponding to a decrease in line width of 9%. If, for example, the intensity at position 105 were 10% lower than the intensity along nominal edge 103, then an increase in exposure beyond 10% of nominal would cause line feature 101 to print excessively narrow. Exposing patterns in the mask 526 need not take identical shapes to the desired wafer patterns. For example, FIG. 3 shows a set of shapes for use in a mask 526 that are designed to print the patterns illustrated in FIG. 2.

Referring to FIG. 3, the background transmission (in regions such as 320) of the mask is nominally 100%. Mask line features such as 321 are almost opaque, and print as line patterns (such as pattern 101) on the wafer. Though dark on the mask, features such as 321 are given a residual transmission of 6.5% with phase-shift of 180°. This is a well-known method for improving image contrast. The patterns depicted in FIG. 3 for the mask may also employ the well-known assist feature method for improving depth of focus. The assist features are shown as 35 nm features such as 323 and 322 that are placed halfway between adjacent line features. The mask features repeat periodically in the horizontal direction. In FIG. 3, the mask features do not have patterning in the vertical direction. However, it is known that designs with patterning along a second dimension can, in some cases, give better performance even when the desired patterns have a one dimensional appearance. Reference may be had to the publication "Optimum Mask and Source Patterns to Print a Given Shape," cited above. It is considered that vertical patterning would be needed if one wished to print the same patterns in a 90°-rotated orientation. Although this is not the case for the example provided, a non-zero periodicity is chosen in the vertical direction. In fact, a vertical periodicity that is equal to the horizontal periodicity is used (i.e., a square periodicity is used). Accordingly, each wafer period (245 nm, 275.6 nm, or 315 nm) is depicted in FIG. 3 as one unit in a 3×3 block of repeated unit periods. The central period is indicated in FIG. 3 as a block with different shading, as in block 324. Alternatively, the three unit periods could be regarded as sub-blocks in a common 2205 nm×2205 nm wafer period (including 9×9 repetitions of the cell that has 245 nm pitch, or 8×8 repetitions of the 275.6 nm pitch cell, or 7×7 repetitions of the 315 nm pitch cell).

The range of doses within acceptable tolerance for a given mask is determined by evaluating the image intensity at the extreme boundaries of the allowable range of shapes. For example, and referring back to FIG. 2, the allowable range of doses that will print line feature 101 within tolerance is determined by the image intensities along the minimum allowable exposure line 104 and the maximum allowable exposure line 105. In this example, the mask patterns are one-dimensional (FIG. 3), so only the intensity at single sample points along lines 104 and 105 need be calculated. Sample points are shown in FIG. 4.

Figure 4A:
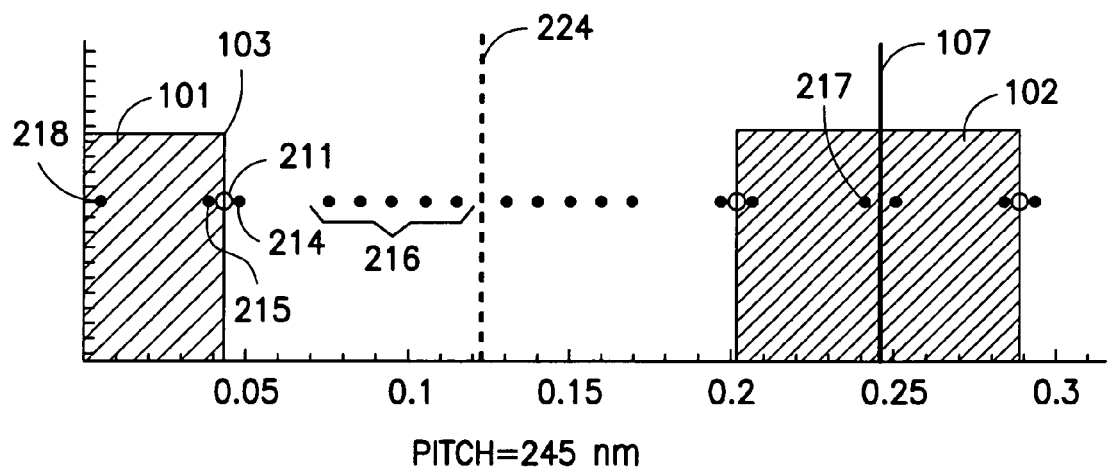
FIGS. 4A–C, collectively referred to as FIG. 4, show an exemplary set of image sample points for testing shapes such as those appearing in FIG. 2.
Figure 4B:
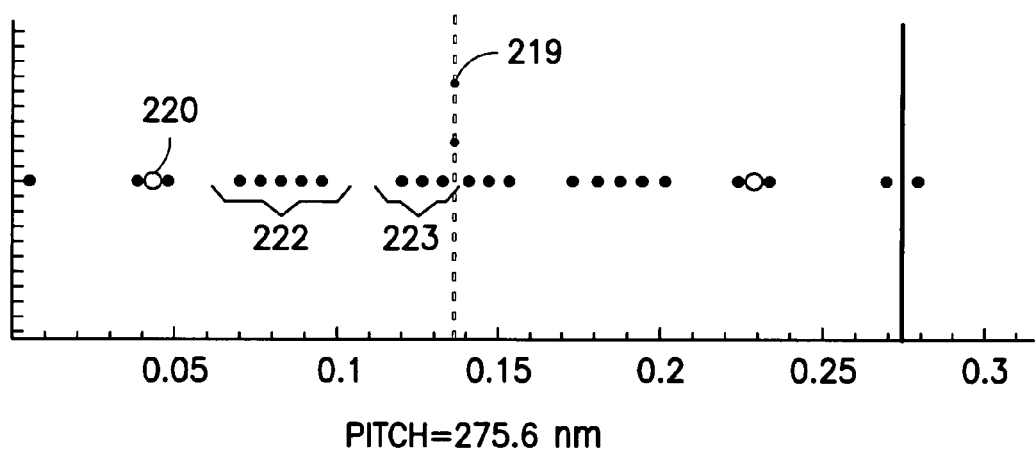
Figure 4C:
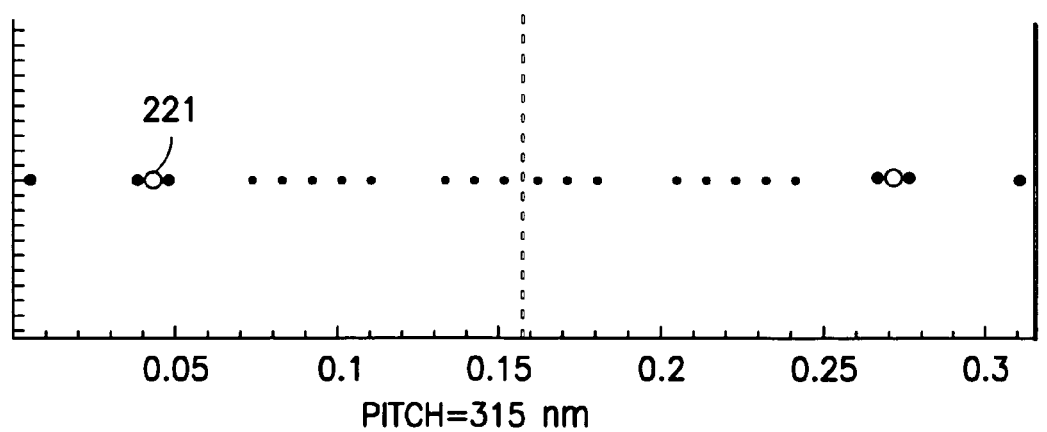

FIGS. 4A–4C, collectively referred to as FIG. 4, depict sample points in correspondence to a shape. In the embodiment shown, the shape corresponds to the exemplary lines 101, 102 depicted in FIG. 2.

In FIG. 4A, sample points are shown corresponding to the pair of lines 101, 102 having a 245 nm pitch depicted in FIG. 2A. A sample point 211 correlating to a position along nominal edge 103 is shown. The nominal edge 103 is some specified distance from the centerline 224, in this example 43.75 nm, which is half the desired width of line 101.

Sample points 214 and 215 are shown, and correspond to the single points along the minimum allowable exposure line 104 and the maximum allowable exposure line 105, respectively.

Various bright sample points 216 are also shown. Successful printing of a set of mask patterns requires that each pattern print with appropriate polarity, as well as with acceptable dimensions. For example, the dose at the bright-polarity sample points 216 must be large enough to ensure development of resist in this region. Therefore, requirements for this region may be established, such as a requirement that the dose be at least, for example, 120% of a predetermined threshold.

If one desires that the 87.5 nm wide line print with the same CD (in this example, 87.5 nm) in all pitches using a nominal dose, the intensity at point 211 ($\vec{s} \cdot \vec{I}$) is preferably constrained to be about the same as the intensity at sample point 220 and sample point 221, shown in FIG. 4B, and FIG. 4C, respectively. Following the example established in FIG. 2, sample point 220 and sample point 221 lie along the nominal edges 103 of the lines features 101 in the 275.6 nm (FIG. 2B) and 315 nm (FIG. 2C) pitch patterns, respectively.

In an extended region of the image it is not necessary to test the intensity of every bright sample point individually. Instead, the points can be grouped in sets, with each set covering image regions of width, for example, $\leq 0.3\lambda/NA$ $(1+\sigma_{Max})$, where $\sigma_{Max}$ refers to the relative direction cosine (normalized against NA) of the most obliquely incident illumination direction that can be provided.

A plurality of bright sample points are identified for bright regions that are sufficiently extended. When sample points are grouped in sets, it is generally considered adequate to assess image polarity using a sparser spacing between the sets than would be needed for ungrouped sample points. The averaged sample points may be treated computationally as a single point. Therefore, as used herein, the term "sample point" may be used to refer to a group of appropriately averaged sample points. As an example, the 275.6 nm pitch pattern depicted in FIG. 4 includes a first group of sample points 222, and a second group of sample points 223. Note that sample point 223, though explicitly including only the three points to the left of period centerline 219, can be regarded as averaging two sets of three points. That is, the sample point 223 accounts for the three points to the left of the centerline 219, as well as the three -points symmetrically disposed to the right of centerline 219. This follows from the bilateral symmetry of the masks 526 depicted in FIG. 3, and from the bilateral source symmetry discussed below.

If centerline 219 is then taken as the effective position of a sample point corresponding to the second group of sample points 223, the separation between first group of sample points 222 and the second group of sample points 223 is about $0.37\lambda/NA(1+\sigma_{Max})$. This separation is considered to be a suitable value for spacing bright sample points (and groups thereof) in extended bright areas. Further, relying on bilateral symmetry also permits the omission of sample points in half the unit period. For example, refer to the area of the chart as shown in FIG. 4B, corresponding to the right half of the line 101.

Preferably, sample points are also added to identify dark regions. For convenience, these sample points are referred to as "dark sample points." The intensity at dark sample point 218 may be constrained to be no larger than a selected value. For example, the dark sample point may be limited to a dose level that is about 40% of a predetermined threshold. Note that 218, though a single point, may be used effectively as a grouped point since it can be regarded as being symmetrically paired about the origin with point 217. Sample points may either be specified manually by the user, or they may be deployed automatically with spacings of magnitude of about $0.4\lambda/NA(1+\sigma_{Max})$, and group widths of $\leq \approx 0.3\lambda/NA(1+\sigma_{Max})$.

Source pixelation is now considered for the sample embodiment. As was discussed earlier, the three sample pitches can be associated with particular diffraction orders from a 2205 nm unit cell (taken to be a square), namely those orders which are multiples of 7, 8, or 9. Though the example only involves vertical lines, a source pixelation that could support horizontal lines as well may be chosen (though each individual pattern is assumed to be modulated along only one axis, i.e. unstructured along the other).

Figure 5:
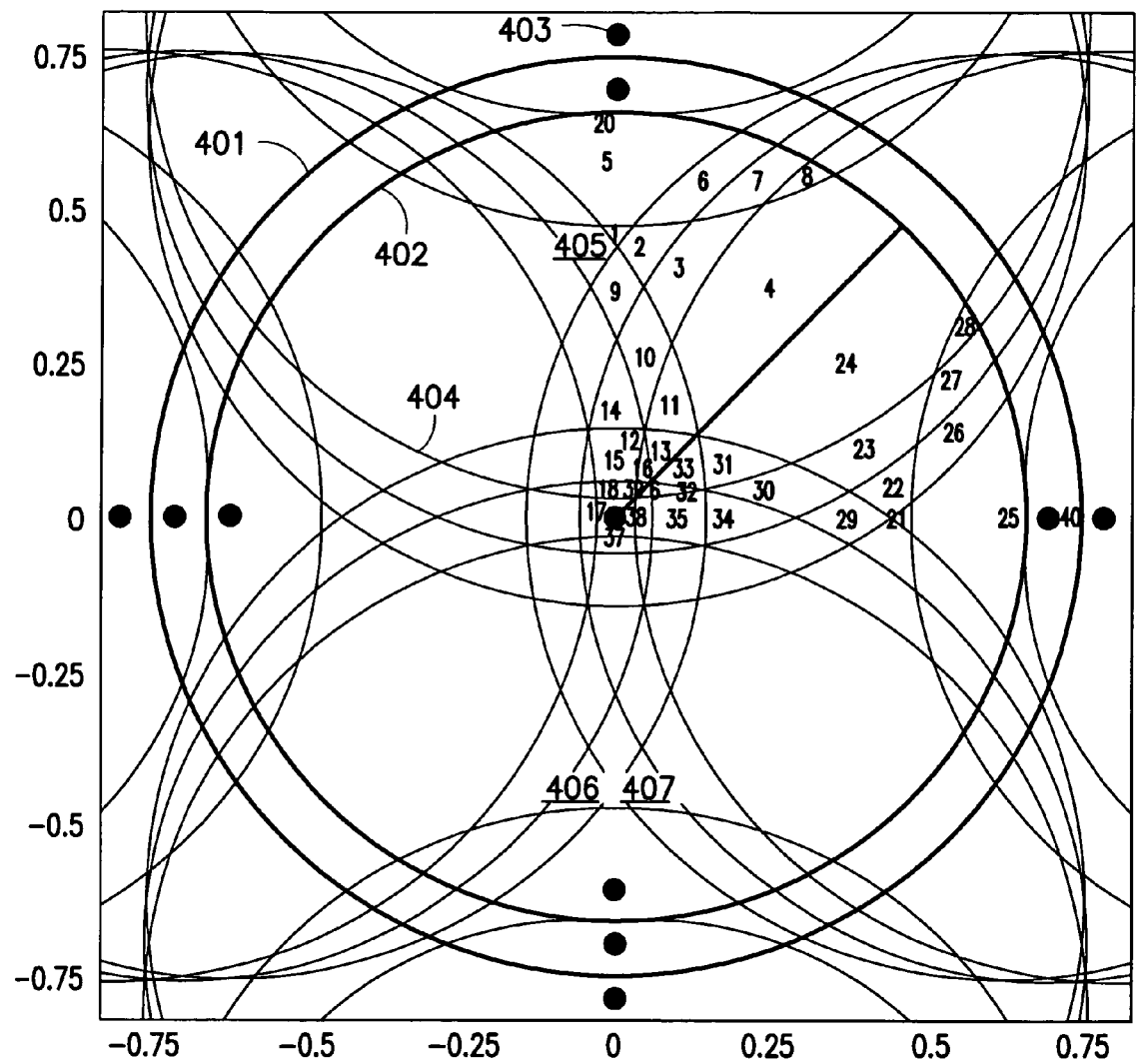
FIG. 5 shows aspects of the pixelation of the source, as would be applied to the example in FIG. 2.

If a source pixelation method, such as one described in U.S. Pat. No. 6,563,566 is applied under these conditions, the (prior art) source construction shown in FIG. 5 is obtained. Aspects of this method are now summarized, and are described in relation to existing (prior art) techniques.

In FIG. 5, outer circle 401 represents the lens pupil 401, of radius equal to the lens NA. In this example, the numerical aperture (NA) equals 0.75. The two dimensional space of the FIG. 5 graph represents illumination and collection directions. More specifically, the x and y axes of FIG. 5 represent the x and y direction cosines of light beams that illuminate masks (such as mask 526 depicted in FIG. 3), and light beams that diffract from them. The inner circle 402 represents the maximum obliquity in illumination that the lithographic tool can support. In this case, the radius $\sigma_{Max}$ of circle 402 (expressed as a fraction of the NA, as is customary) is 0.88 NA. The directions at which diffraction orders propagate from the mask under illumination at normal incidence are plotted in FIG. 5 as dots, such as dot (order) 403. Additional circles of radius NA, for example circle 404, are centered about vertices located at each diffracted order 403. If the mask 526 is illuminated from a direction other than normal incidence, the direction at which each order diffracts will shift, and this shift can cause the order direction to either shift into or out of collection pupil 401. This is determined by circles like 404. For example, circle 404 represents the range of illumination directions which cause order 403 to be collected by pupil 401. The resulting overlap areas between the circles, items 1 to 40, represent suitable source pixelations in the case where only the in-focus image is considered. This is because the same in-focus image is produced (in the absence of aberrations) by every illumination direction within a particular overlap region, since each such illuminating direction causes the same set of orders to be collected.

It should be noted, as explained further in U.S. Pat. No. 6,563,566, that the source pixels 1–40 actually represent symmetrical illumination patterns, rather than isolated oblique sets of directions. For example, the source region denoted 2 actually refers to the four-fold symmetric illumination pattern that comprises regions 405, 406, and 407, in addition to the region labeled as 2. Such mirroring is preferred to limit anomalies (such as image skew) through focus. The intensity of illumination light for regions 405, 406, and 407 is equal to that for region 2.

It should also be noted that one does not need to define a common multiple pitch when optimizing multiple patterns. An example that obeys this condition was chosen for FIG. 2 simply to improve clarity in the FIG. 5 pixelation diagram. That is, this example was chosen to provide an illustrative case with a visually even and regular appearance. However, in general, pixelation of an illumination source, as introduced in reference to FIG. 5, may be constructed for multiple mask objects by simply superposing atop one another the construction circles 404 that arise in the different masks about diffraction orders like 403.

An aspect of this invention is in maximizing the integrated process window through focus. It should be noted that a problem with the construction shown in FIG. 5 is that a large region, such as region 4, can cover a wide range of illumination directions, whose affect on the image can vary widely in focal planes other than the plane of best focus. Techniques disclosed herein may be used to account for this effect by subdividing the larger regions (such as region 4) into smaller units. One example is shown in FIG. 6. It is considered that it is generally reasonable to use subdivisions having an area of about $\frac{1}{50}$ or $\frac{1}{100}$ that of one quadrant of the range of possible illuminating directions (i.e., an area that is about $\frac{1}{200}$ or $\frac{1}{400}$ that of the entire circle 402).

Thus, in FIG. 6 the regions which have a large area, such as regions 4 and 24 as shown in FIG. 5, have been subdivided into smaller regions. For example, regions 4 and 24 appearing in FIG. 5 have been divided into 12 subdivisions in FIG. 6. Regions depicted in FIG. 5 having small or moderate area (such as regions 1 or 11) may be retained without further division. Each of the subdivisions shown in FIG. 6, or the undivided small-to-moderate sized regions, represents an independent "source pixel." A source pixel is also referred to as a "source element."

Referring to FIG. 6, various regions are shown. One may note that a symmetry exists between region 4 and region 24. For convenience, the pixels are identified using two numbers, which correlate to a "region-source element" nomenclature. For example, pixel 1-1 corresponds to the undivided source region 1. Pixel 4-3 corresponds to the source element at position x=0.196, y=0.247, which corresponds to the $3^{rd}$ subdivision of region 4. As provided for in the construction depicted in FIG. 6, the intensity associated with each source element actually represents the intensity for a set of mirror-symmetric directional source elements. The set preferably contains four members, due to the preferred four-fold symmetry of the source, i.e. bilateral symmetry about the horizontal and vertical planes. If one seeks to print the same patterns in both horizontal and vertical orientations, one can employ sets (containing eight members) that are also symmetrical about the 45-degree and 135-degree diagonals. Such a set might include, for example, elements 4-5 and 24-5, shown in FIG. 6.

Once the source elements have been defined, the image intensities provided by a unit source intensity applied to each element are calculated for each of a number of focal planes. For example, in one embodiment it is considered reasonable to choose a focal step on the order of $0.1\lambda/NA^2$ between the focal planes, and to step through a sufficient number of focal planes to ensure that intensities are calculated for a focal range that will exceed the achievable depth of focus. As an example, in one embodiment, the calculation might be stepped to a maximum defocus of $5\lambda/NA^2$. The intensity of the element-illuminated images can be calculated using standard methods, as discussed elsewhere herein. FIGS. 7–10 depict examples of intensity calculated for two elements. These intensities are referred to as trial intensities, as calculation of the trial intensity is a preliminary step in choosing the intensities that will actually be provided. The projections involved need not be carried out in simulation, these may instead be determined experimentally.

Figure 7:
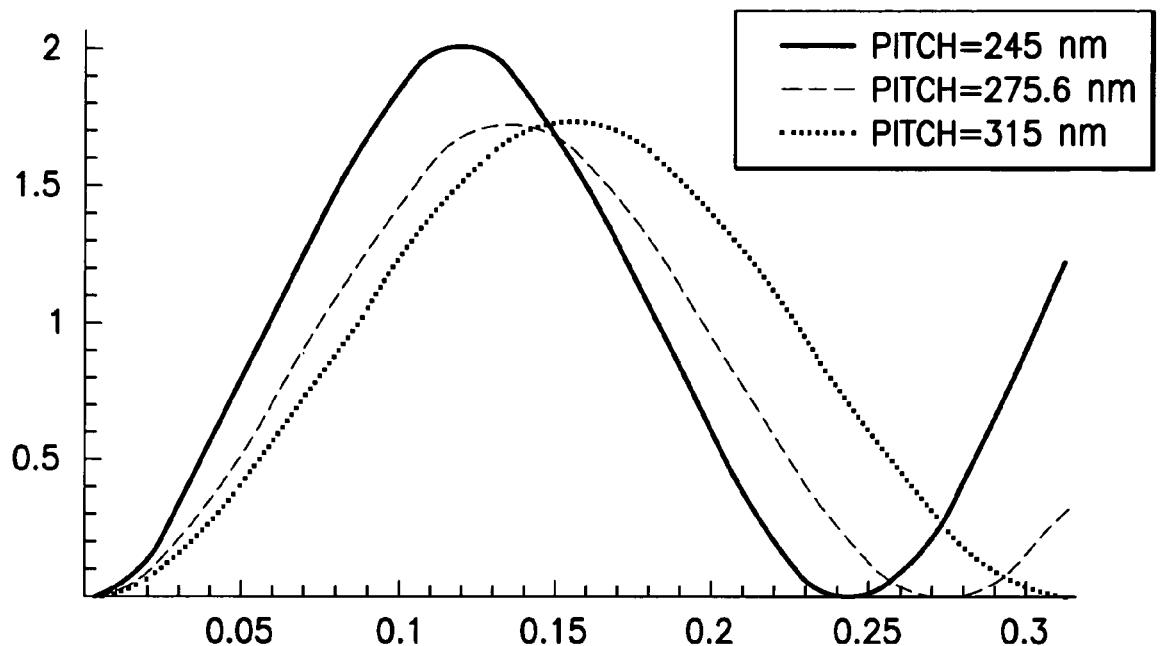
FIG. 7 depicts the focused image produced by a particular source pixel, in the FIG. 5 example. This represents a trial image that would be obtained if the source pixel were given unit intensity.
Figure 8:
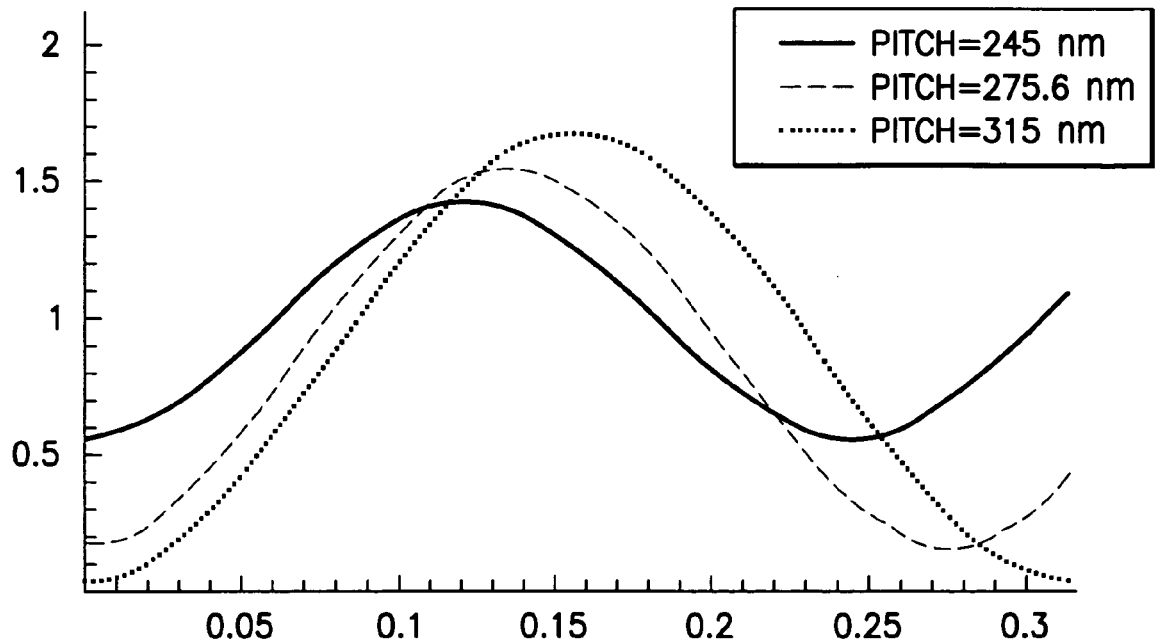
FIG. 8 depicts the defocused trial image produced by the particular source pixel of FIG. 7.
Figure 9:
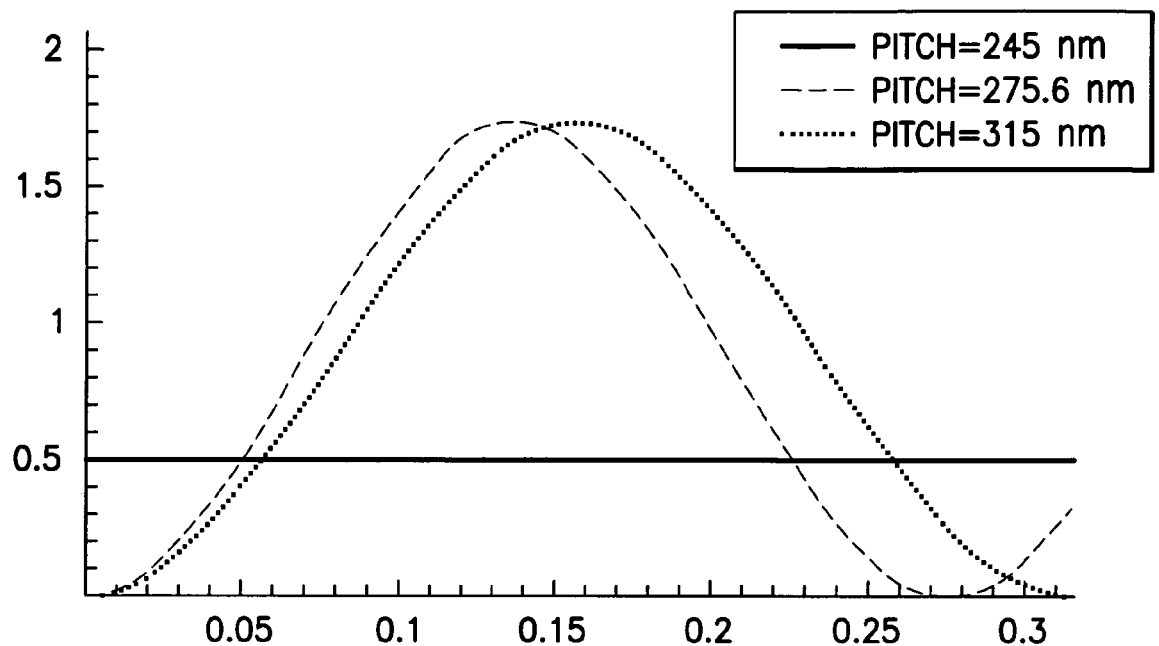
FIG. 9 depicts the focused trial image produced by another source pixel in the FIG. 5 example.
Figure 10:
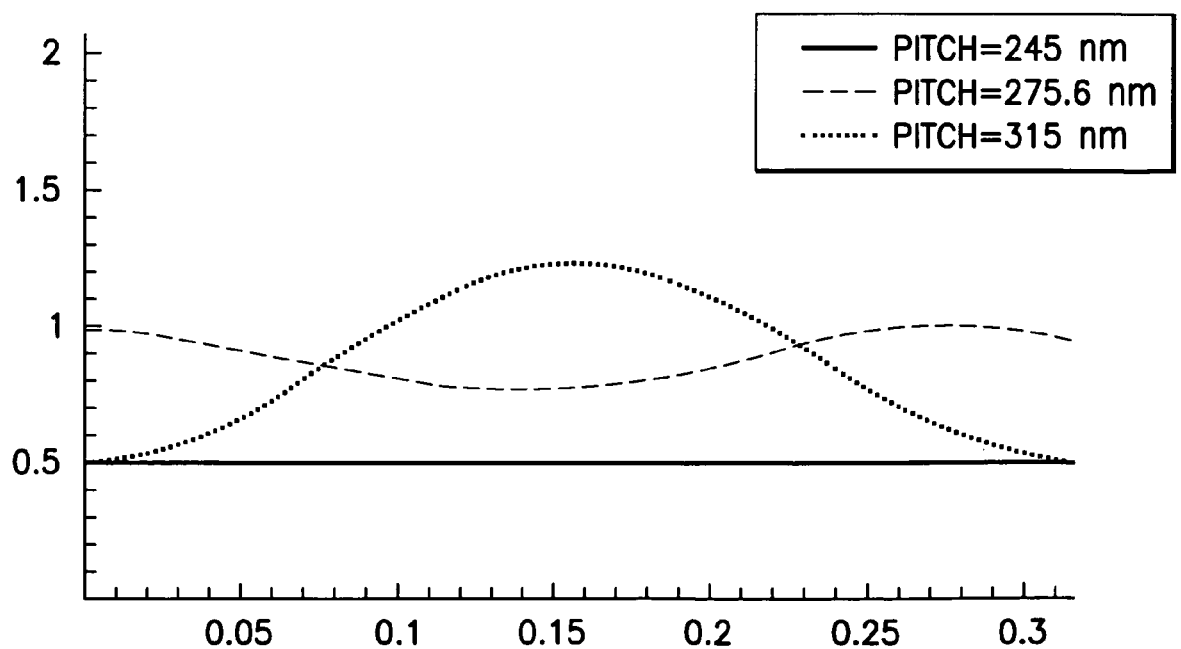
FIG. 10 depicts the defocused trial image produced by the particular source pixel of FIG. 9.

In FIG. 7, the calculated trial intensity is depicted for source element 4–6, when the image is in focus. The graph of FIG. 7 presents curves for each of the three exemplary embodiments depicted in FIGS. 2–4. FIG. 8 depicts the trial intensity produced from source element 4-6, when the image is defocused, at 0.3 µm. Again, curves for each of the three exemplary embodiments depicted in FIGS. 2–4 are presented. FIG. 9 and FIG. 10 make a corresponding presentation for source element 3-2.

The image intensity provided by a more complex source can be obtained as a weighted sum of these element-illuminated trial images, since a particular source element is given a unit intensity when calculating the trial images (with all other sources given zero intensity). For example, in one embodiment, the image intensity may be obtained by a weighted sum of the corresponding intensity values for each element. Therefore, at a given sample point (for example, the pth sample point), the trial image intensities in a particular focal plane (for example, the kth focal plane) constitute a vector of proportionalities $\vec{I}_p(k\,\Delta z)$, and the intensity at the sample point from a complex source defined by a vector of source element intensities $\vec{s}$ is given by $\vec{s} \cdot \vec{I}_p(k\,\Delta z)$.

The presently preferred methods disclosed herein illuminate the mask with a set of source elements having optimum intensity $\vec{s}$ to maximize the integrated process window. In mathematical terms, it is desired to determine the list of source intensities $\vec{s}$ that solves the following problem:

$$\underset{w.r.t.\,\vec{s}}{\text{Maximize}} \; \frac{\int_0^F df \left\{ \underset{r}{\text{Min}} \left( \underset{z=0}{\overset{z=f}{\text{Min}}} \left[ \frac{1}{\vec{s} \cdot \vec{I}_r(CD_+, z)} \right] \right) - \underset{r}{\text{Max}} \left( \underset{z=0}{\overset{z=f}{\text{Max}}} \left[ \frac{1}{\vec{s} \cdot \vec{I}_r(CD_-, z)} \right] \right) \right\}}{\left( \frac{1}{\vec{s} \cdot \vec{I}_1(0,0)} \right)} \quad \text{(Eq. [2])}$$

where $F \equiv$ $$\text{Min}\left[ f, \text{ such that } \underset{r}{\text{Min}}\left( \underset{z=0}{\overset{z=f}{\text{Min}}} \left[ \frac{1}{\vec{s} \cdot \vec{I}_r(CD_+, z)} \right] \right) = \underset{r}{\text{Max}}\left( \underset{z=0}{\overset{z=f}{\text{Max}}} \left[ \frac{1}{\vec{s} \cdot \vec{I}_r(CD_-, z)} \right] \right) \right],$$

subject to constraints:

A) $\sum_{j=1}^{J_{Max}} s_j \geq S_{Min}$

B) $s_j \leq S_{Max,j}$      $(\forall\, j | 1 \leq j \leq J_{Max})$

C) $0 \leq s_j$      $(\forall\, j | 1 \leq j \leq J_{Max})$

D) $\vec{s} \cdot \vec{I}_1(0,0) = \text{non-present constant } Q$      $(\forall\, r | 1 \leq j \leq r_{Max})$ E) $\vec{s} \cdot \vec{I}_u(0,0) \geq I_{Bright} Q$      $(\forall\, u | 1 \leq u \leq u_{Max})$ F) $\vec{s} \cdot \vec{I}_v(0,0) \leq I_{Dark} Q$      $(\forall\, v | 1 \leq v \leq v_{Max})$ As can be appreciated, in the above formulation the problem is expressed in a highly nonlinear form. The merit function to be maximized in Eq. [2] (which may also be referred to as an objective function) is essentially the integral of the exposure latitude through the depth of focus. More precisely, the merit function is the integral of the normalized exposure latitude over all achievable depths of focus. As maximizing the percentage (or fractional) exposure latitude across focus is desired, the unknown exposure values appear in the numerator as well as the denominator of the objective function (Eq. [2]). Note that the absolute exposure level is not a controlling factor in this context, since it can be adjusted separately on the exposure tool, for example by changing exposure time. For simplicity, the exposure value chosen for the denominator in the fractional normalization is taken as the nominal exposure for printing the first (r=1) edge.

Exposure latitude is the range of exposure between the upper and lower exposure limits, for a given focal range (f). The upper and lower exposure limits involve double maximizations or double minimizations. For example, the achieved exposure latitude can be no larger than the exposure latitude that is attained by the weakest feature in the pattern. Accordingly, the maximum exposure in the integrand is taken as the minimum exposure over r of the upper exposure limits attained at each edge. Likewise the minimum exposure is the maximum over r of the lower exposure limits. In addition, for a particular exposure level to be considered valid over a given focal range f, it is not sufficient that the exposure merely print all CDs within tolerance at defocus z=f, the exposure must also be adequate to successfully print the CDs at all intermediate focal planes between z=0 and z=f. Preferably, the variable of integration f is interpreted as focal range and not as a simple defocus. The maximum allowable exposure in a given focal range f is thus the minimum of the upper exposure limits achieved across all focal planes within the range z=0 to z=f.

Similarly, the lower exposure limit is defined in terms of a double maximization over r and z. Note that maximizations and minimizations are nonlinear and slope-discontinuous in the variables involved.

The limit of integration F is also defined in a non-linear manner, namely as the focal range at which the exposure latitude first closes down to zero. Thus, F is the maximum attainable depth-of-focus (DOF), that is, F is the "length" of the ED window if exposure latitude is regarded as the "width" of the window. For simplicity, Eq. [2] neglects aberrations other than defocus, however this restriction is not necessary.

It will be clear to those skilled in the art that the constraints in the exemplary problem can be managed in a number of suitable ways. Furthermore, the constraints presented for Eq. [2] are representative, and are not limiting. As presented, constraint A enforces a minimum pupil fill, constraint B sets maximum intensity limits for each source element (e.g., a limit proportional to element area in the pupil), constraint C rules out unphysical negative intensities, constraint D enforces CD requirements on the nominal image, constraint E requires that nominally bright regions indeed print bright, and constraint F that dark regions print dark.

Eq. [4] and Eq. [5] below provide two approximations that can be made for Eq. [2]. In the first approximation, the integration is replaced by a summation over focus grid points (or planes). These grid points are spaced by a distance $\Delta z$ which is small compared to the depth of focus. As noted above, a defocus step of $\Delta z=0.1\lambda/NA^2$ is considered reasonable.

To illustrate the second approximation, a simpler approximation is first presented. This is for purposes of illustration only, and is not actually used as the second approximation.

First, an assumption is made that CD errors, and CD tolerances throughout the depth of focus, are numerically small when compared to the lens resolution. That is, it is assumed that the allowable variation in a feature width is small when compared to the width of the actual feature. Such an assumption implies that the range of intensity variations appearing at image edges will be small when compared to the baseline intensity level of the nominal image contour, as long as the image is printed within the ED window of interest. This permits one to make an expansion of the form:

$$\vec{I}_r(CD_\pm, z) \cong \vec{I}_1(0,0) + \varepsilon_r \mp \frac{\Delta CD}{2} \frac{\partial \vec{I}_r}{\partial x} + \frac{z^2}{2} \frac{\partial^2 \vec{I}_r}{\partial z^2} + \frac{z^4}{24} \frac{\partial^4 \vec{I}_r}{\partial z^4} + \ldots \quad \text{(Eq. [3])}$$

with $\varepsilon_r \equiv \vec{I}_r(0,0) - \vec{I}_1(0,0)$, and where all quantities on the second line are considered small compared to the first term, $\vec{I}_1(0,0)$. Odd powers of z may be included in Eq. [3], where aberrations are non-zero. Note again that Eq. [3] is presented for purposes of explanation only.

Assuming the approximation of Eq. [3] is valid, the function in Eq. [2] can be manipulated to obtain the approximation:

$$\frac{\int_0^F df \left\{ \underset{r}{\text{Min}}\left(\underset{z=0}{\overset{z=f}{\text{Min}}}\left[\frac{1}{\vec{s} \cdot \vec{I}_r(CD_+, z)}\right]\right) - \underset{r}{\text{Max}}\left(\underset{z=0}{\overset{z=f}{\text{Max}}}\left[\frac{1}{\vec{s} \cdot \vec{I}_r(CD_-, z)}\right]\right) \right\}}{\left(\frac{1}{\vec{s} \cdot \vec{I}_1(0,0)}\right)} \cong \quad \text{(Eq. [4])}$$

$$\frac{\int_0^F df \left\{ \underset{r}{\text{Min}}\left(\underset{z=0}{\overset{z=f}{\text{Min}}}\left[\vec{s} \cdot \vec{I}_r(CD_-, z)\right]\right) - \underset{r}{\text{Max}}\left(\underset{z=0}{\overset{z=f}{\text{Max}}}\left[\vec{s} \cdot \vec{I}_r(CD_+, z)\right]\right) \right\}}{\vec{s} \cdot \vec{I}_1(0,0)}$$

Eq. [4] approximates the percentage (or fractional) of exposure latitude by fractional intensity latitude. Due to the fractional normalization $\vec{s}$ continues to appear in both numerator and denominator, and the integrand continues to be defined by double maximizations and double minimizations.

Eq. [4] is the approximation that is actually made in Eq. [2], rather than the nominally more restrictive Eq. [3], although Eq. [3] has been shown to be quite accurate as well. Therefore, the integrated fractional intensity latitude is maximized through focus, rather than integrated fractional exposure latitude. Note that the integrated fractional intensity latitude is a reasonable figure of merit, therefore the optimization disclosed herein need not depend on the Eq. [3] approximation.

As was noted, the right-side integral in Eq. [4] is approximated by a discrete sum:

$$\frac{\int_0^F df \left\{ \text{Min}_r \left( \text{Min}_{z=0}^{z=f} \left[ \vec{s} \cdot \vec{I}_r(CD_-, z) \right] \right) - \text{Max}_r \left( \text{Max}_{z=0}^{z=f} \left[ \vec{s} \cdot \vec{I}_r(CD_+, z) \right] \right) \right\}}{\vec{s} \cdot \vec{I}_1(0,0)} \cong \quad \text{(Eq. [5])}$$

$$\frac{\Delta z \sum_{k=0}^{k=\frac{F}{\Delta z}} \left\{ \text{Min}_r \left( \text{Min}_{j=0}^{j=k} \left[ \vec{s} \cdot \vec{I}_r(CD_-, j\Delta z) \right] \right) - \text{Max}_r \left( \text{Max}_{j=0}^{j=k} \left[ \vec{s} \cdot \vec{I}_r(CD_+, j\Delta z) \right] \right) \right\}}{\vec{s} \cdot \vec{I}_1(0,0)}.$$

After making the approximations provided in Eq. [4] and Eq. [5], Eq. [2] can be solved by introducing new variables $K_{Max}, w_1 \ldots w_{Kmax}, w'_1 \ldots w'_{Kmax}$, making a further change of variables $\vec{s} \rightarrow \vec{a}$, and then solving the following equations:

$$\underset{w.r.t. K_{Max}}{\text{Maximize}} \left( \underset{w.r.t. \vec{a}}{\text{Maximize}} \left[ \Psi \left( K_{Max}; \vec{a} \right) \right] \right), \quad \text{Eq. [6]}$$

where objective $\Psi$ is defined by: $\Psi\left(K_{Max}; \vec{a}\right) \equiv$ $$\sum_{k=1}^{K_{Max}} (w'_k - w_k),$$

subject to:

a) $0 \leq a_j S_{Min} \leq S_{Max,j} \sum_{j=1}^{J_{Max}} a_j \quad (\forall j | 1 \leq j \leq J_{Max})$ b) $\vec{a} \cdot \vec{I}_r(0,0) = 1 \quad (\forall r | 1 \leq r \leq r_{Max})$ c) $\vec{a} \cdot \vec{I}_u(0,0) \geq I_{Bright} \quad (\forall u | 1 \leq u \leq u_{Max})$ d) $\vec{a} \cdot \vec{I}_v(0,0) \leq I_{Dark} \quad (\forall v | 1 \leq v \leq v_{Max})$ e) $w_k \geq \vec{a} \cdot \vec{I}_r(CD_+, k\Delta z) \quad (\forall r, k | 1 \leq r \leq r_{Max}, 0 \leq k \leq K_{Max})$ f) $w'_0 \geq \vec{a} \cdot \vec{I}_r(CD_+, k\Delta z) \quad (\forall r, k | 1 \leq r \leq r_{Max}, 0 \leq k \leq K_{Max})$ g) $\vec{a} \cdot \vec{I}_1(0,0) \geq \vec{a} \cdot \vec{I}_1(CD_+, 0) \quad (\forall r | 1 \leq r \leq r_{Max})$ h) $\vec{a} \cdot \vec{I}_1(0,0) \leq \vec{a} \cdot \vec{I}_1(CD_-, 0) \quad (\forall r | 1 \leq r \leq r_{Max})$ i) $w'_k \leq \vec{a} \cdot \vec{I}_r(CD_-, k\Delta z) \quad (\forall r, k | 1 \leq r \leq r_{Max}, 0 \leq k \leq K_{Max})$ j) $w_0 \leq \vec{a} \cdot \vec{I}_r(CD_-, k\Delta z) \quad (\forall r, k | 1 \leq r \leq r_{Max}, 0 \leq k \leq K_{Max})$ k) $w_k \geq w_{k-1} \quad (\forall k | 1 \leq k \leq K_{Max})$ l) $w'_k \leq w'_{k-1} \quad (\forall k | 1 \leq k \leq K_{Max})$ m) $w_k \leq w'_k \quad (\forall k | 0 \leq k \leq K_{Max})$ The required source intensities are then obtained from:

$$s_j = a_j \underset{j}{\text{Min}} \left[ \frac{S_{Max,j}}{a_j} \right]. \quad \text{(Eq. 7)}$$

Before explaining the derivation of Eq. [6] and Eq. [7], it is instructive to first consider their general structure. If a fixed value is chosen for $K_{Max}$, Eq. [6] becomes a pure linear programming problem in $\vec{a}$, which is easily solved as linear programming problems can be solved globally using known algorithms that are highly efficient. The constraints include some redundancy (for example, constraint j follows from constraints i and m). Depending on the linear program solver used, one may choose to eliminate redundant constraints like j. The outer maximization for $K_{Max}$ remains to be solved and is highly nonlinear; however, it only involves a single variable. Therefore it is feasible to find the global solution for $K_{Max}$ using a simple one dimensional grid search. This type of a search may be referred to herein as a "focal range loop." Moreover, for all cases tested, it was found that the outer $K_{Max}$ dependence exhibited a simple single-peaked behavior. Thus, it is possible to optimize $K_{Max}$ by local search. For example, one may start at a conservative value of $K_{Max}$ given by the ratio of the conventional solution DOF to $\Delta z$, and one finds that as $K_{Max}$ is increased, the objective function first increases steadily to a maximum and then rapidly decreases upon further expansion of the depth of focus, and quickly reaches a point where the constraints are no longer achievable. When aberrations are small but non-zero, one may also solve for the lower focal limit by making a local search about $z=-\Delta z K_{Max}$ by testing successively $z=\Delta z K_{Max}$, $z=-\Delta z (K_{Max}-1)$, $z=-\Delta z (K_{Max}+1)$, etc.

To explain how Eq. [6] and Eq. [7] may be used to solve Eq. [2], Eq. [4], and Eq. [5], it is first noted that the structure of the left-side of Eq. [4], while strongly nonlinear in numerical terms, has an algebraic structure that is predominantly linear in $\vec{s}$, and that can be converted into a linear equivalent.

An immediate, but seemingly improper way to remove the fractional nonlinearity (i.e., the nonlinearity that arises because $\vec{s}$ appears in both numerator and denominator), is to simply constrain the denominator to be 1 (i.e., the focused intensity $\vec{s} \cdot \vec{I}_1(0,0)$ at the first edge position is constrained to have a value of unity). The remaining task for solving Eq. [4] is then determining a maximum value for the numerator alone, which is closer to solving a linear problem. However, it is noted that imposing an artificial requirement of unit intensity at edge position 1 will almost always force a non-optimal solution, so that in itself such a unit-intensity requirement does not provide the desired solution. While it is sometimes true that a fully optimal solution can be rescaled within a limited range (e.g., to adjust edge intensity at position 1 to a specific value such as 1), achievement of unit intensity at edge position 1 would generally require that either constraint A or constraint B for Eq. [2] be violated. Rescaling the optimal solution means increasing or decreasing all source intensities by a common factor. However, it is considered that this would eventually (usually rather quickly) either cause the overall source intensity to drop below $S_{Min}$ (constraint A), or the intensity of a particular source intensity (e.g., the $j^{th}$) to increase above $S_{Max,j}$ (constraint B).

However, without unrecoverable loss of generality, it is considered that the problem can be temporarily reformulated so that constraints A and B are replaced by a single constraint. This constraint requires that the fraction of the total source intensity of a given source element be no larger than ratio of the maximal allowable intensity of that element to the total required source intensity. The source intensities satisfying this revised constraint will not in general satisfy the constraints in Eq. [2], so these changed source intensities are denoted with the new symbol $\mathbf{\mathit{s}}$, rather than the symbol $\vec{s}$ used previously. In mathematical terms, the new merged version of constraints A and B is then:

$$\frac{\mathit{s}_j}{\sum_{j=1}^{J_{Max}} \mathit{s}_j} \leq \frac{S_{Max,j}}{S_{Min}}, \quad \text{Eq. [8]}$$

which, when cast in linear form, yields constraint a for Eq. [6]. Note that as written, constraint a also includes constraint C of Eq. [2]. Expressed in the $\mathit{s}$ variables, constraint b of Eq. [6] provides a linearizing constraint that the focused intensity at the first edge position have a value of unity.

Once Eq. [6] is solved for $\mathit{s}$, the desired global solution to Eq. [2] (as modified by Eq. [4] and Eq. [5]) can be determined by using Eq. [7]. This global solution satisfies the original constraints A and B. Note that the intensity at edge position 1 is no longer artificially set to unity in the final solution for $\vec{s}$, which is as it should be since the unit-intensity constraint was merely adopted as an intermediate aid to solution.

Even after the above changes, the numerator of Eq. [5] still contains non-linear characteristics arising from the maximizations and minimizations, and from the presence of the maximum focal window extent F (defined in Eq. [2]). As noted above, the non-linearity in F can be accounted for by simply stepping through possible terminating focal planes in an outer solution loop. This process assures global applicability of the solution. However, in practice, single-parameter local optimization in the outer loop can be used to reliably solve for F.

Next, the nonlinear characteristics represented by the embedded minimizations and maximizations in Eq. [2] and Eq. [5] are considered. These are removed by reformulating the objective for Eq. [5] in terms of additional variables that are subject to linear constraints. Specifically, new variables w' and w are introduced into each of the stepped focal planes along the z-axis, with w' essentially representing the darkest of the bright boundaries of the allowable range of shapes, and w representing the brightest of the dark boundaries. The linear constraints that introduce the w and w' variables, namely constraints i and e in Eq. [6], do not define these variables so stringently; instead, they merely impose the weaker requirements that $w'_k$ (and $w_k$) be below (or above) the intensities at all bright-boundary (or dark-boundary) sample points in the $k^{th}$ focal plane. The $w'_k$ and $w_k$ variables are actually pushed to those strict limits during maximization of the objective function $\Psi$ in Eq. [6]. This is automatically achieved in our formulation because any withdrawal of these variables from the i and e binding limits would degrade the objective function $\Psi$ without easing any other constraints. Hence such withdrawal cannot occur when the objective function $\Psi$ is optimally set by the linear program solver.

Constraint k in Eq. [6] ensures that, in addition to being brighter than all dark-boundaries in the $k^{th}$ focal plane, $w_k$ is also brighter than the dark-boundaries in all focal planes within the truncated range $0 \leq f \leq k\Delta z$. In fact, $w_k$ achieves this brightest value during optimization of $\Psi$, for the reason explained in the previous paragraph. Thus, $1/w_k$ represents the largest exposure that keeps the pattern in tolerance throughout the focal range $f \leq k\Delta z$, while $1/w'_k$ represents the smallest allowable exposure. Since $w_k$ and $w'_k$ take on these values, the Eq. [6] objective function $\Psi(\mathit{s})=\Sigma(w'_k-w_k)$ represents, when maximized, the integrated process window (within the accuracy of the Eq. [4] and Eq. [5] approximations). As previously explained, use of the new variable $\mathit{s}$, instead of $\vec{s}$, insures that it is the fractional exposure latitude that $\Psi$ integrates.

Figure 11:
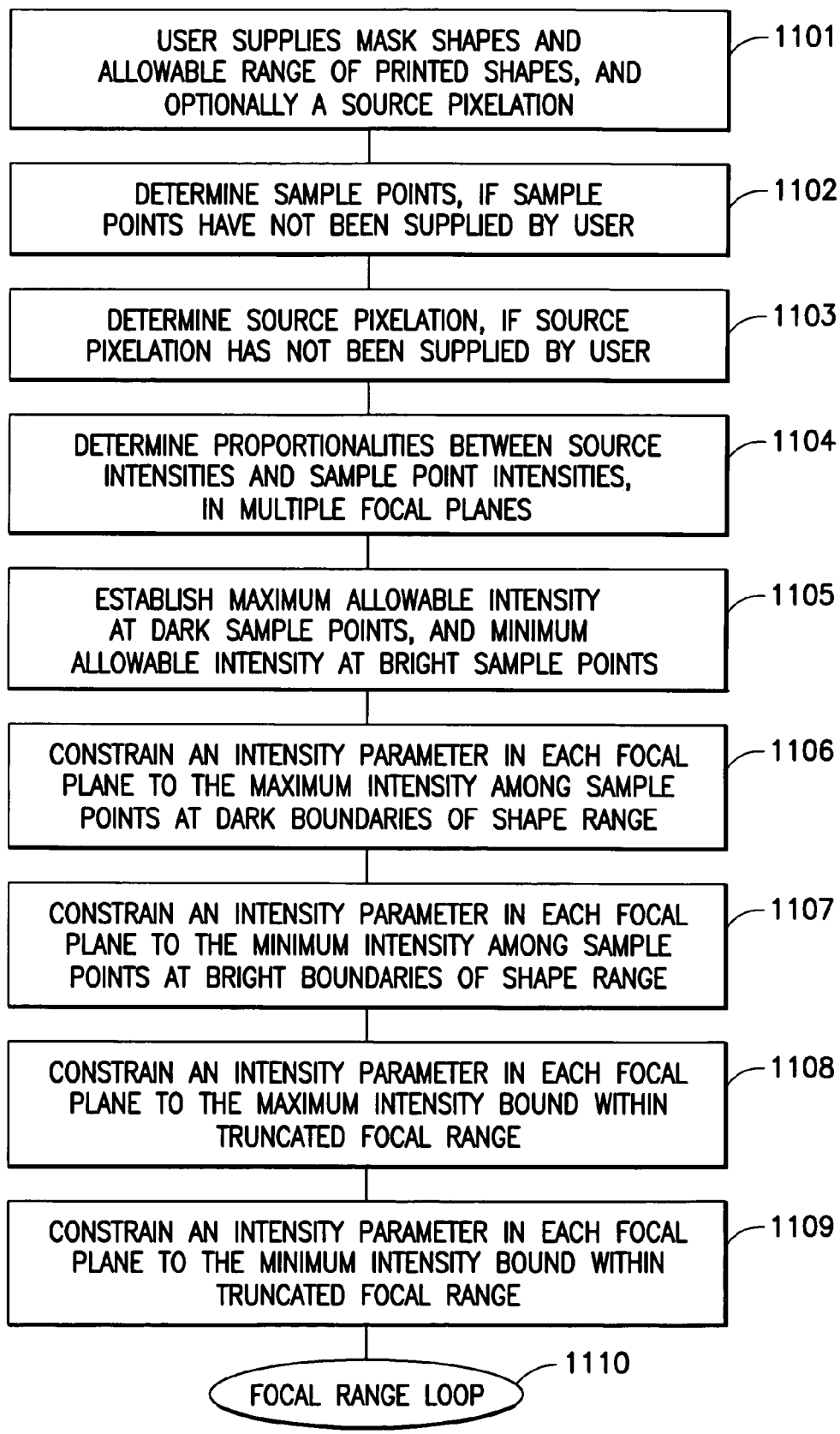
FIG. 11 provides a flowchart for maximizing the integrated process window.
Figure 12:
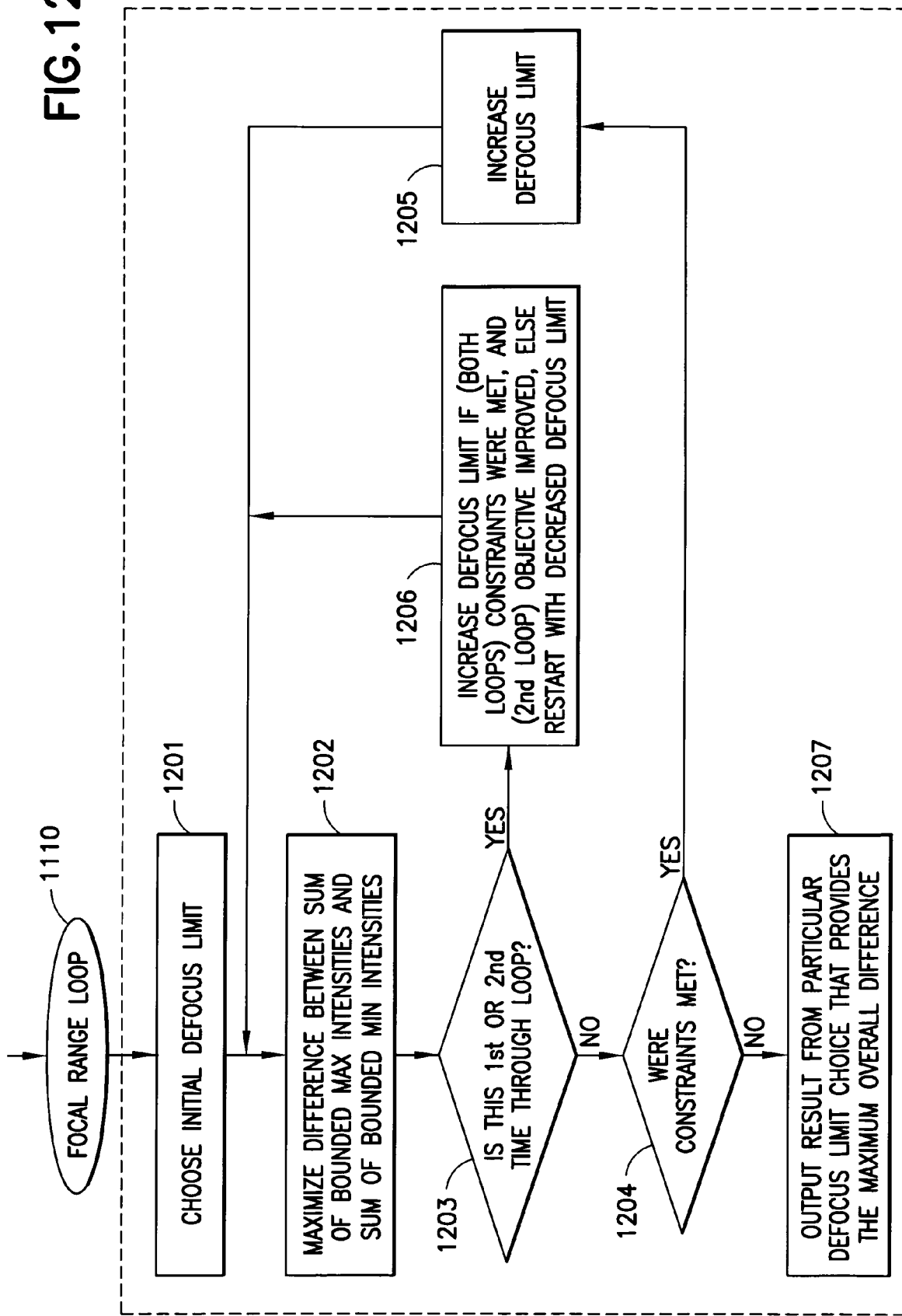
FIG. 12 provides a flowchart with further steps for maximizing the integrated process window.

FIG. 11 and FIG. 12 explain in flowchart form the above procedure for obtaining the source solution. FIG. 11 shows the full procedure, and FIG. 12 shows within the dashed box an expanded description of the focal range loop.

A summary of the preferred embodiment for obtaining the source solution is provided in FIG. 11. In step 1101, a user supplies mask shapes and an allowable range of printed shapes, and optionally a source pixelation. In step 1102, sample points are determined.

In step 1103, source pixelation is determined (if not performed in step 1101). In step 1104, the user determines proportionalities between the source intensities and the sample point intensities, for multiple focal planes. In step 1105, maximum allowable intensity at dark sample points, and minimum allowable intensity at bright sample points is determined. In step 1106, an intensity parameter is constrained in each focal plane to the maximum intensity among sample points at dark boundaries of the range for the shape. In step 1107, an intensity parameter in each focal plane is constrained to the minimum intensity among sample points at bright boundaries of the range for the shape. In step 1108, an intensity parameter in each focal plane is constrained to the maximum intensity bound within a truncated focal range. In step 1109, an intensity parameter in each focal plane is constrained to the minimum intensity bound within the truncated focal range. In step 1110, a focal range loop is entered.

FIG. 12 illustrates a preferred embodiment of the focal range loop (step 1110 of FIG. 11). In FIG. 12, an initial defocus limit is chosen in step 1201. Subsequently, the difference between the sum of bounded maximum intensities and the sum of the bounded minimum intensities is maximized in step 1202. A determination is then made whether a first or second iteration through the focal range loop is underway, in step 1203. If this is a first iteration through the loop, then a determination is made in step 1204 whether constraints were met. If the constraints were met, then the defocus limit is increased in step 1205. The actions in step 1202 are again undertaken, and a determination is again made in step 1203 as to whether this is a first or second iteration. The defocus limit is increased in step 1206 if constraints were met and the objective improved in the second iteration, otherwise the defocus limit is decreased. The focal range loop terminates in step 1207 with output of results that provide the maximum sum of differences between the minimum and maximum intensities.

Figure 13:
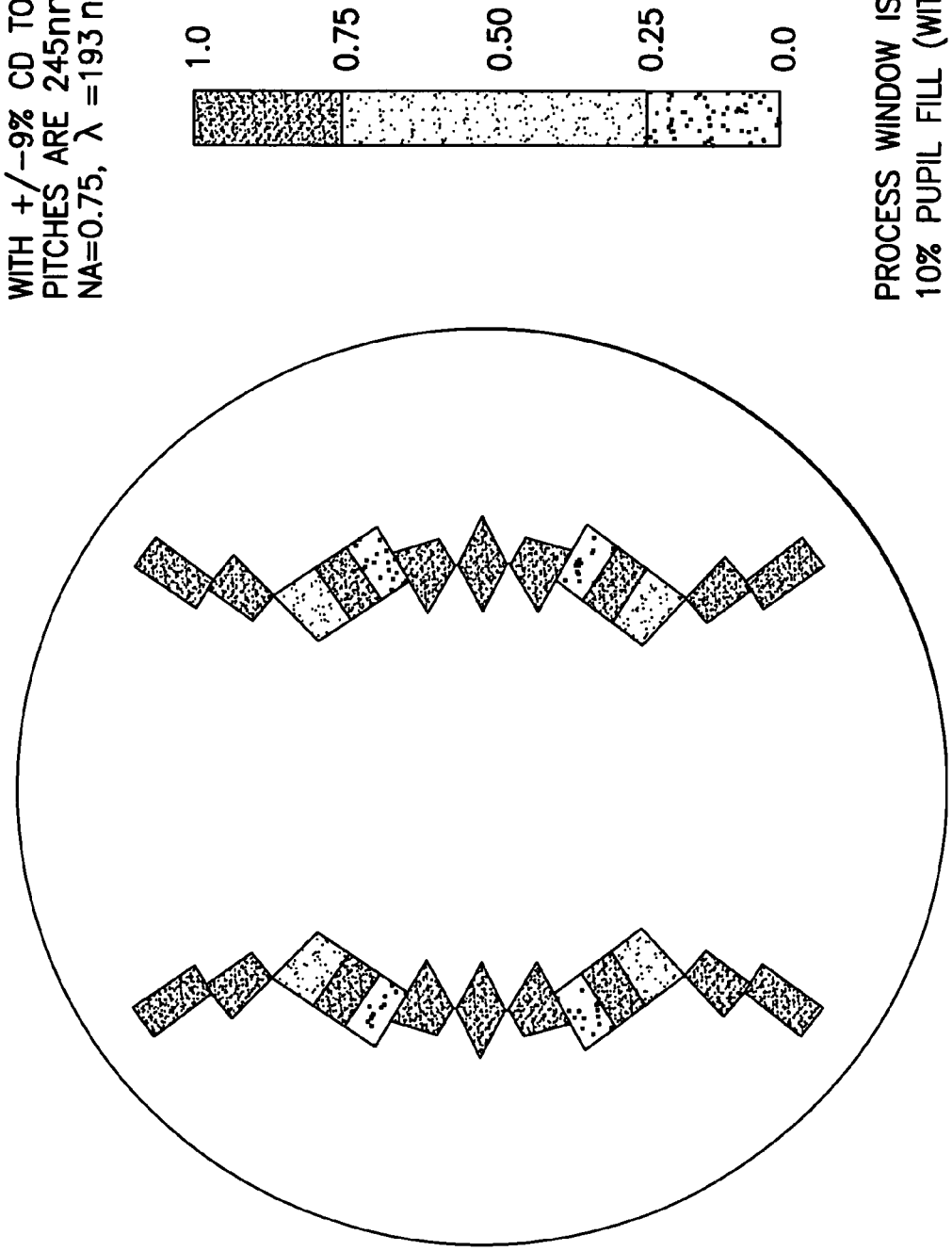
FIG. 13 depicts an illumination distribution that maximizes the integrated process window for the example of FIG. 2; and, FIG. 14 depicts an embodiment of a system for maximizing the integrated process window.

FIG. 13 shows the source solution obtained by this procedure in the example of the FIG. 2 patterns. In tabular form, the FIG. 13 solution is:

| Source Region | Source Intensity |
|---|---|
| 4-9 | 0.017601 |
| 4-11 | 0.017764 |
| 23-1 | 0.023122 |
| 24-4 | 0.001306 |
| 24-5 | 0.017662 |
| 24-6 | 0.012216 |
| 29-1 | 0.010328 |

Figure 14:
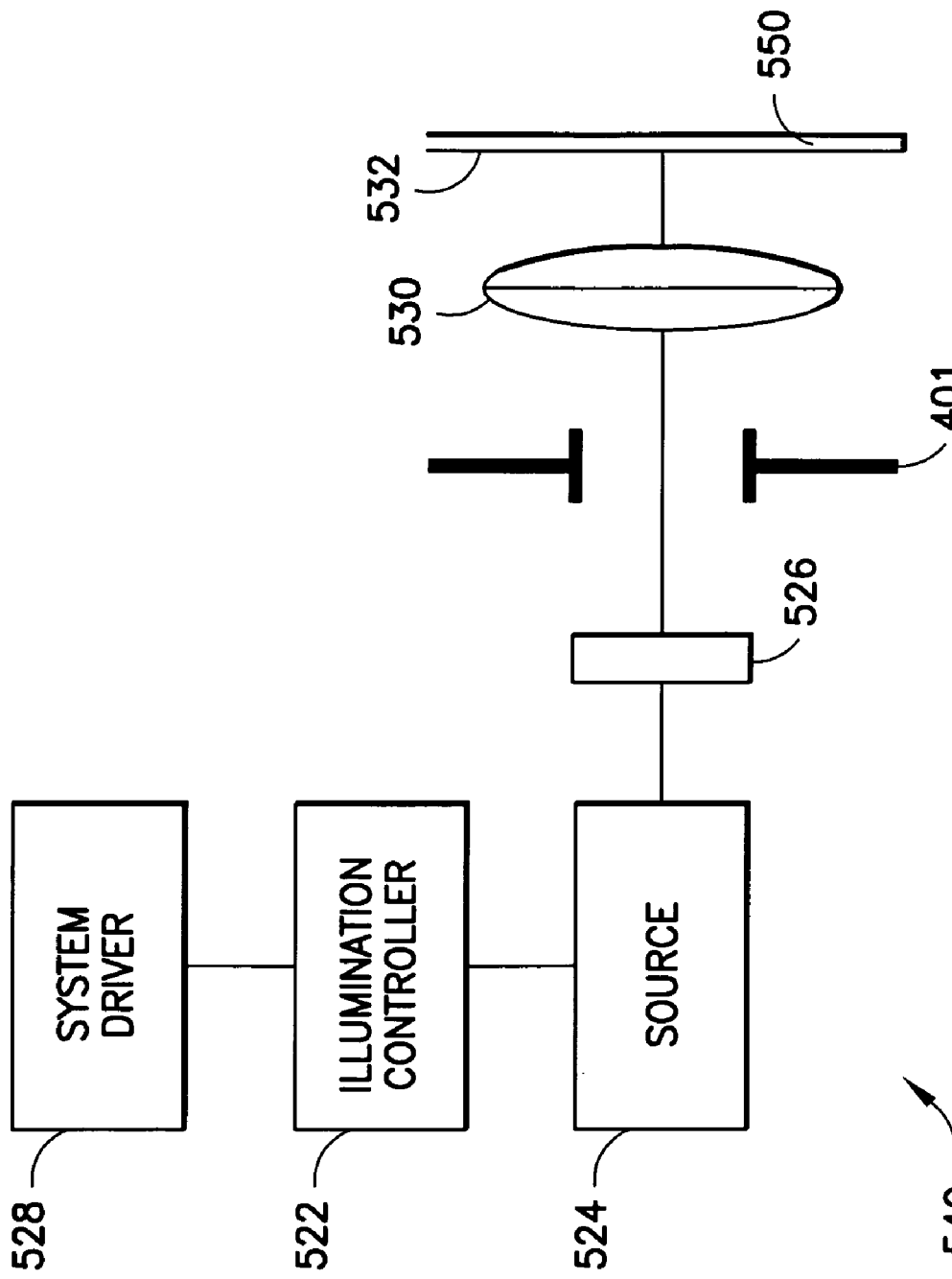

FIG. 14 depicts one embodiment of a system 540 that includes a system driver 528 for operating in accordance with the teachings herein. Preferably, the system driver 528 communicates with, and may control, the illumination controller 522. Preferably, the system driver 528 provides for execution of instructions for obtaining the source solution. The system driver 528 may include any equipment as appropriate for execution of the instructions. Non-limiting examples of system driver 528 components include a computer, software (a computer program), a computer readable medium or memory (such as a magnetic and/or optical disk drive, tape, semiconductor storage, and other types of memory). Other system driver components may be included. Preferably, the system 540 makes use of other components present in prior art lithography systems 520, such as those shown in FIG. 1.

Other Embodiments:

Many modifications to the above method are possible, and several (non-limiting) examples are now provided.

For example, the method can be extended to handle multiple exposures. The different exposures can be carried out with different masks, optical parameters, polarizations, pupil filters, or focal settings.

Any exposure model that is linear in the source intensity can be accommodated (so long as the intensity at a point can be expressed in the form $\vec{s} \cdot \vec{I}$). This can include, for example, the effect of resist blur.

The process window can be optimized to reduce the effect of typical mask errors. For example, instead of optimizing the source to maximize the common window for printing several image patterns each with its own mask (e.g., maximizing common window for printing the patterns of FIG. 2 using the masks of FIG. 3), the common window for printing each single image feature using a variety of different masks can be maximized, where these masks may differ from one another only in being perturbed by different simulated fabrication errors. For example, the common window of a line feature 101 might be optimized over two mask patterns, each containing a line 101 that is rendered on the mask with either the largest or smallest width that the mask supplier would permit when trying to achieve nominal mask width. In this way an ideal balance can be struck in a tradeoff that may arise between optimizing the error-free image and minimizing the sensitivity to mask error.

Constraints can be added to enforce minimum acceptable exposure latitude in the image, either at best focus, or in a particular defocused plane.

It is not necessary to constrain the image to exactly achieve the nominal CD at best focus and exposure across all sample cross sections. Such equality constraints can instead be replaced by band constraints. Further, one can choose to remove these constraints altogether, since in their absence the ED objective function continues to constrain all CDs to at least remain within tolerance, which in some cases may be all that is desired.

Two-pass strategies can be devised that make use of less rigorous CD constraints along features such as lines 101, described above. Consider, for example, the following procedure: An initial source optimization is carried out with no CD equality constraints and with relaxed CD tolerances. For example, one might impose CD tolerances for the ED window that are two times less restrictive than the tolerances actually desired. Next, with the source held fixed at the newly found solution, an optical proximity correction (OPC) program is used to restore the CDs to their nominal values at best focus and exposure. The source can then be re-optimized for the modified mask with the full CD constraints and tolerances in place. One can be sure of convergence as long as the OPC program provides guaranteed local convergence.

Constraints on the source intensities can be added that enforce a resemblance of the source to some nominal illumination pattern. This ensures that image quality in non-critical features will not be severely impacted when the optimization is carried out using only a few critical features.

So far, a method for obtaining an optimum process latitude as predicted by a model has been described. That is, any model in which the intensity at a given point can be expressed as $\vec{s} \cdot \vec{I}$. A similar approach can be used to provide an empirical yield improvement in a manufacturing context. The general idea is to limit the allowable changes in the source intensities while deliberately specifying target CDs that do not match a design. This allows an empirical counter-bias to be introduced for, as an example, correcting small measured errors in printed features. If the exposure tool has a programmable illuminator, this method would allow such targeted corrections to be carried out very quickly, without ordering a new mask.

Some of the foregoing modifications are required to prevent excess degradation of non-critical features when source optimization is applied to critical features. This is realized by limiting the departure of the optimized source from some nominal illumination pattern. Further, constraints may be adopted that set upper limits to the intensity of particular source elements that have been found (in previous calculations) to adversely affect the process window for patterns other than the current critical features being used as targets.

One skilled in the art will recognize that the invention disclosed herein is not limited to printing a mask with maximum possible process window through adjustment of the source distribution, as disclosed herein, and that the teachings herein may be employed in a variety of embodiments. As examples, other embodiments are disclosed herein for enhancing operation of a lithography system and the resulting features produced. Accordingly, it is considered that these and other additional embodiments are within the teachings of this invention, which is described by the appended claims.

What is claimed is:

1. A mask illumination method, comprising:
    illuminating a lithographic mask with light from different directions such that intensities of a plurality of incident beams of light provide a largest possible integrated process window defined in terms of an allowed range for defining shapes, comprising
    imposing, through application of at least one set of constraints, a first set of intensity parameters for representing maximum possible intensities that can be permitted for overexposed tolerance positions and a second set of intensity parameters for representing minimum possible intensities that can be permitted for underexposed tolerance positions; and, determining optimum source intensities of incident beams using a linear program and constraints that comprise at least said one set of constraints, where the determined optimum source intensities maximize an integrated range of at least one of dose variations and focal variations without causing printed shapes to depart from the allowed range.

2. A method as in claim 1, where boundaries of the process window impose shape limits corresponding to at least one of underexposed and overexposed conditions.

3. The method of claim 1, further comprising, prior to determining, defining for each of a plurality of different focal ranges at least one parameter for each of the first set and the second set,
and wherein the determined optimum source intensities maximize an integrated range of dose and focal variations without causing printed shapes to depart from the allowed range.

4. A system for illuminating a mask, comprising
means for illuminating a photolithographic mask with light from different directions such that intensities of a plurality of incident beams provide a largest possible integrated process window defined in terms of an allowed range for defining shapes, said illuminating means comprising means for imposing, through application of at least one set of constraints, a first set of intensity parameters for representing maximum possible intensities that can be permitted for overexposed tolerance positions and a second set of intensity parameters for representing minimum possible intensities that can be permitted for underexposed tolerance positions; and means for determining optimum source intensities of incident beams from the means for illuminating using a linear program and constraints that comprise at least said one set of constraints, where the determined optimum source intensities maximize an integrated range of at least one of dose variations and focal variations without causing printed shapes to depart from the allowed range.

5. A system as in claim 4, where boundaries of the process window impose shape limits corresponding to at least one of underexposed and overexposed conditions.

6. A system as in claim 4, where the mask is used to project patterns onto a wafer.

7. The system of claim 4, further comprising:
means for defining, for each of a plurality of different focal ranges, at least one parameter for each of the first set and the second set;
and wherein the determined optimum source intensities maximize an integrated range of dose and focal variations without causing printed shapes to depart from the allowed range.

* * * * *